(12) United States Patent
Sumita

(10) Patent No.: US 6,750,677 B2
(45) Date of Patent: Jun. 15, 2004

(54) DYNAMIC SEMICONDUCTOR INTEGRATED CIRCUIT

(75) Inventor: Masaya Sumita, Amagasaki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/163,232

(22) Filed: Jun. 4, 2002

(65) Prior Publication Data

US 2002/0180485 A1 Dec. 5, 2002

(30) Foreign Application Priority Data

Jun. 4, 2001 (JP) .................................... 2001-168412

(51) Int. Cl.$^7$ .............................................. H03K 19/00
(52) U.S. Cl. ........................ 326/94; 326/95; 326/96; 326/97; 326/98
(58) Field of Search ................... 326/93–98, 105, 326/106, 108

(56) References Cited

U.S. PATENT DOCUMENTS

| | | | |
|---|---|---|---|
| 5,737,270 A | 4/1998 | Oppold et al. | |
| 5,789,956 A | 8/1998 | Mahant-Shetti et al. | |
| 6,020,763 A | 2/2000 | Gabillard | |
| 6,060,910 A | 5/2000 | Inui | |
| 6,081,136 A | 6/2000 | Khanna et al. | |
| 6,172,531 B1 * | 1/2001 | Aipperspach et al. | 326/108 |
| 6,205,463 B1 | 3/2001 | Manglore et al. | |
| 6,456,118 B2 * | 9/2002 | Beat | 326/105 |

FOREIGN PATENT DOCUMENTS

| | | |
|---|---|---|
| JP | 9-107274 | 4/1997 |
| JP | 10-27481 | 1/1998 |
| JP | 11-68549 | 3/1999 |
| JP | 2000-251479 | 9/2000 |

OTHER PUBLICATIONS

May 1999, Klass et al. "A new family of semidynamic and dynamic flip–flops with embedded logic for high–performance processors" IEEE Journal of Solid–State Circuits, vol. 34, No. 5, pp 712–716.

Feb. 1989, Yuan et al. "High–speed CMOS circuit technique" IEEE Journal of Solid–State Circuits, vol. 24, No. 1, pp 62–70.

Oct. 1987, Yuan et al. "A true single–phase–clock dynamic CMOS circuit technique" IEEE Journal of Solid–State Circuits, vol. sc–22, No. 5, pp. 899–801.

* cited by examiner

*Primary Examiner*—Anh Q. Tran
(74) *Attorney, Agent, or Firm*—Merchant & Gould P.C.

(57) ABSTRACT

A dynamic semiconductor integrated circuit is provided, in which an operation speed is increased, an operation is stabilized, and low power consumption is realized in a system where a NAND dynamic circuit is connected to a NOR dynamic circuit. A compensating circuit is provided, which compensates for a voltage drop at an output node of the NOR dynamic circuit due to a coupling capacitance formed between the output node of the NOR dynamic circuit and an output node of the NAND dynamic circuit, caused when the output node of the NAND dynamic circuit is discharged while the output node of the NOR dynamic circuit holds a charge.

36 Claims, 17 Drawing Sheets

DYNAMIC SEMICONDUCTOR INTEGRATED CIRCUIT

BACKGROUND OF THE INVENTION

1. Field of the Invention

The present invention relates to a dynamic semiconductor integrated circuit used in a decoder circuit such as a memory circuit and a matching detection circuit. In particular, the present invention relates to a technique for speeding up a semiconductor integrated circuit in which a NAND dynamic circuit is connected to a NOR dynamic circuit. Furthermore, the present invention relates to a circuit arrangement technique for preventing degradation of the transistor characteristics in such a semiconductor integrated circuit.

2. Description of the Related Art

In a decoder circuit such as a memory circuit that is synchronized with a clock, in order to increase speed, a NAND dynamic circuit has been used so as to reduce the number of logic stages and the capacity of a gate of a decoder circuit with a static configuration. In a matching detection circuit for comparing a plurality of data with each other to detect whether or not they are matched, used in a comparison portion of a translation lookaside buffer (TLB) and a tag part of a cache, in order to increase speed, a differential sense amplifier system for comparing voltage differences has been used. Examples of the sense amplifier system include circuit systems described in JP 10(1998)-27481 A and JP 2000-251479 A. The above-mentioned circuits are those of a latch type for holding data only in a logic "H" level period or a logic "L" level period of a clock.

Examples of a flip-flop circuit increasing speed, for holding output data of a decoder circuit or a matching detection circuit during one period of a clock, include those described in "A rue Single-Phase-Clock Dynamic CMOS Circuit Technique" (YUAN JI-REN et al.) in IEEE JOURNAL OF SOLID-STATE CIRCUITS, VOL.SC-22, NO.5, OCTOBER 1987 and "A New Family of Semidynamic and Dynamic Flip-Flops with Embedded Logic for High-Performance Processors" (Fabian Klass et al.) in IEEE JOURNAL OF SOLID-STATE CIRCUITS, VOL. 34, NO. 5, MAY 1999.

In the case of the above-mentioned conventional configuration, along with miniaturization of a semiconductor, a power source voltage is lowered only with a NAND dynamic circuit. Therefore, in order to maintain speed increases, there is a limit to the number of serial stages. Furthermore, according to the method of YAN JI-REN et al. and Fabian Klass et al. in which a NAND dynamic circuit is connected to an output of a NOR dynamic circuit, when an input element of the NOR dynamic circuit is at a logic "L" level, during a period in which a clock transitions from a logic "L" level to a logic "H" level, an output node of the NOR dynamic circuit is in a floated state, an output of the NAND dynamic circuit of a subsequent stage becomes a logic "L" level, and a coupling capacitance formed between the output node of the NOR dynamic circuit and the NAND dynamic circuit holds a charge. Therefore, the output voltage of the NOR dynamic circuit is lowered, and the operation speed is degraded.

Furthermore, in the matching detection circuit using an analog element, when a device area is decreased, the variation in characteristics of an element is increased in accordance with a scaling rule of miniaturization, and an operation becomes unstable. On the other hand, when the operation of an element is stabilized, wiring and the like becomes long due to an increased area of a device, which makes it difficult to realize increased speed.

Another problem is caused along with miniaturization of a semiconductor. More specifically, when a shallow trench insulator (STI) is formed in a semiconductor substrate so as to separate transistors or circuit blocks, a lattice constant of a molecular structure that is a characteristic of a diffusion region constituting a source or a drain of a MOS transistor is distorted Because of this, stress is applied to the diffusion region of a transistor formed in a region close to the STI. Consequently, charge mobility is decreased, a current ability (Ids) is lowered, and a threshold voltage ($V_{th}$) is increased. More specifically, the characteristics of transistors close to the STI and transistors, in which an interval of a diffusion capacity portion between the transistors is small, are degraded.

SUMMARY OF THE INVENTION

Therefore, with the foregoing in mind, it is an object of the present invention to provide a semiconductor integrated circuit in which increased speed is realized by a system in which a NAND dynamic circuit is connected to a NOR dynamic circuit, glitches occurring in an output of the NAND dynamic circuit are reduced to realize a stable operation and low power consumption, and transistor characteristics are prevented from being degraded by a miniaturization process.

In order to achieve the above-mentioned object, a first semiconductor integrated circuit of the present invention includes: a NOR dynamic circuit for receiving a first clock (CLK1) and a plurality of first data (ADR [0–4], holding a charge of a first output node in a case where during one of a period from rising to falling of the first clock and a period from falling to rising of the first clock, the first output node is charged, and during the other period, all the plurality of first data are matched with each other, and discharging the first output node in a case where at least one of the plurality of first data is not matched; a NAND dynamic circuit for receiving a second dock (CLK2, CLK3) and a signal from the first output node, holding a charge of a second output node in a case where during one of a period from rising to falling of the second clock and a period from falling to rising of the second dock, the first output node is discharged, and discharging the second output node in a case where the charge of the first output node is held; and a compensating circuit for compensating for a voltage drop of the first output node, which is caused by a coupling capacitance formed between the first output node and the second output node, which occurs when the second output node is discharged while the charge of the first output node is held According to the above-mentioned configuration, the number of logic stages is reduced, compared with a decoder entirely composed of static circuits. Furthermore, due to the NAND dynamic circuit, compared with the case where a static NAND circuit is provided, the load capacity of a gate that receives a second dock and the load capacity of a gate of the NAND dynamic circuit connected to the output node of the NOR dynamic circuit are reduced. Furthermore, a voltage drop of the output node of the NOR dynamic circuit is compensated by the compensating circuit, whereby an operation speed can be increased.

In the first semiconductor integrated circuit, it is preferable that the compensating circuit includes a feedback circuit for charging the first output node in a case where the second output node is discharged.

According to the above-mentioned configuration, while a signal of the output node of the NAND dynamic circuit transitions from a logic "H" level to a logic "L" level, a voltage drop due to a coupling capacitance is compensated, and a voltage level of the output node of the NOR dynamic circuit can be increased, whereby increased speed can be realized.

In the first semiconductor integrated circuit, it is preferable that the NOR dynamic circuit includes: a first N-type MOS transistor in which a gate is supplied with the first clock and a source is grounded; a first P-type MOS transistor in which a gate is supplied with the first dock and a source is connected to a power source; and a plurality of second N-type MOS transistors in which gates are supplied with the plurality of first data, sources are connected to a drain of the first-N-type MOS transistor and drains are connected to a drain of the first P-type MOS transistor, whereby the first output node is formed.

According to the above-mentioned configuration, the number of serial stages of each transistor is two or less, and increased speed can be realized even at a low voltage.

In the first semiconductor integrated circuit, it is preferable that the compensating circuit includes a P-type MOS transistor in which a gate is connected to a second output node of the NAND dynamic circuit, a source is connected to a power source, and a drain is connected to a first output node of the NOR dynamic circuit.

According to the above-mentioned configuration, the output node of the NOR dynamic circuit is charged by receiving a signal of the output node of the NAND dynamic circuit, which transitions the P-type MOS transistor from a logic "H" level to a logic "L" level, whereby a voltage drop due to a coupling capacitance is compensated, and a voltage level of the output node of the NOR dynamic circuit can be increased, whereby increased speed can be realized.

In the first semiconductor integrated circuit, it is preferable that the compensating circuit includes: an inverter in which an input terminal is connected to a second output node of the NAND dynamic circuit; and an N-25 type MOS transistor in which a gate is connected to an output terminal of the inverter, and a source and a drain are connected in common to the first output node of the NOR dynamic circuit.

According to the above-mentioned configuration, a voltage drop of the output node of the NOR dynamic circuit due to a coupling capacitance can be compensated. In addition, by decreasing a ratio between the fan-in and fan-out of the inverter, the through rate of the output of the inverter can be made very steep, and the voltage of the output node in the NOR dynamic circuit can be raised instantaneously, whereby further speed increases can be realized.

In order to achieve the above-mentioned object, a second semiconductor integrated circuit of the present invention includes: a NOR dynamic circuit for receiving a first clock (CLK1) and a plurality of first data (ADR[0–4]), holding a charge of a first output node in a case where during one of a period from rising to falling of the first clock and a period from falling to rising of the first clock, the first output node is charged, and during the other period, all the plurality of first data are matched with each other, and discharging the first output node in a case where at least one of the plurality of first data is not matched, and a NAND dynamic circuit for receiving a second clock (CLK2, CLK3) and a signal from the first output node, holding a charge of a second output node in a case where during one of a period from rising to falling of the second clock and a period from falling to rising of the second clock, the first output node is discharged, and discharging the second output node in a case where the charge of the first output node is held, wherein the first clock is in phase with the second dock or the first clock is identical with the second clock, and rising times of the first and second clocks are longer than a discharge time of the first output node of the NOR dynamic circuit.

In the second semiconductor integrated circuit, it is preferable that the second clock is subjected to control for beginning and suspension of supply.

According to the above-mentioned configuration, even in the case where the load capacity of the output node of the NOR dynamic circuit is large, glitches occurring in the output of the NAND dynamic circuit can be reduced, and a stable operation and low power consumption can be made possible with only a clock of one system.

It is preferable that the second semiconductor integrated circuit includes a second NOR dynamic circuit, and an inverter in which an input terminal is connected to a third output node of the second NOR dynamic circuit, and the second clock is supplied from an output terminal, wherein the second NOR dynamic circuit includes: a third N-type MOS transistor in which a gate is supplied with the first clock and a source is grounded; a second P-type MOS transistor in which a gate is supplied with the first clock and a source is connected to a power source; and a plurality of fourth N-type MOS transistors in which one gate is connected to a power source, the remaining gates are grounded, sources are connected to a drain of the third N-type transistor, and drains are connected to a drain of the second P-type MOS transistor, whereby the third output node is formed. In this case, among the plurality of fourth N-type MOS transistors, an N-type MOS transistor in which a gate is connected to a power source is for example positioned farthest from the input terminal of the inverter in physical arrangement.

According to the above-mentioned configuration, a current path between the power source and the ground of the NAND dynamic circuit is cut off, and a leakage current is prevented, whereby glitches can be reduced. Accordingly, even in the case where the load capacity of the output node of the NOR dynamic circuit is large, a stable operation and low power consumption can be made possible.

In the first and second semiconductor integrated circuits, it is preferable that the NOR dynamic circuit includes: a first P-type MOS transistor in which a gate is supplied with the first clock and a source is connected to a power source; a switching circuit for receiving a ground potential and the plurality of first data, selectively outputting the ground potential while the first output node of the NOR dynamic circuit is charged, and thereafter, selectively outputting the plurality of data; and a plurality of N-type MOS transistors in which gates are supplied with an output signal of the switching circuit, sources are grounded, and drains are connected to a drain of the first P-type MOS transistor, whereby the first output node is formed.

According to the above-mentioned configuration, unlike a general NOR dynamic circuit, a junction capacity and wiring are not required, and the number of serial stages is reduced, whereby a high-speed operation can be conducted even at a lower voltage.

The first and second semiconductor integrated circuits include a matching detection circuit, wherein the matching detection circuit receives one of a plurality of second data and one of a plurality of third data, detects whether or not the data are matched with each other, and outputs a detection result as the plurality of first data.

According to the above-mentioned configuration, a matching detection circuit capable of being operated at a high speed can be realized in a semiconductor integrated circuit.

In the first and second semiconductor integrated circuits, it is preferable that the second clock is composed of a clock for charging the second output node of the NAND dynamic circuit and a clock for discharging the second output node, the clock for charging is the same as the first clock, and a rising time of the clock for discharging is longer than a discharge time of the first output node of the NOR dynamic circuit.

According to the above-mentioned configuration, even in the case where the load capacity of the output node of the NOR dynamic circuit is large, a stable operation and low power consumption can be made possible, whereby further speed increases can be realized.

In the first and second semiconductor integrated circuits, it is preferable that the NAND dynamic circuit charges the second output node during one of a period from rising to falling of the second clock and a period from falling to rising of the second clock, and holds the charge of the second output node during a half period of the second clock.

The above-mentioned configuration is suitable for a circuit system characterized by a latch configuration such as an SRAM.

It is preferable that the first and second semiconductor integrated circuits include a positive feedback circuit in which inverters are connected in a cascade, and an output terminal of the inverter in a final stage is connected to an input terminal of the inverter in a first stage and the second output node of the NAND dynamic circuit, wherein the positive feedback circuit holds the charge of the second output node during one period of the second clock.

The above-mentioned configuration is suitable for a circuit system characterized by a flip-flop configuration.

In the first and second semiconductor integrated circuits, the first clock and the second dock may have different duty ratios, and voltage levels of the first clock and the second clock may be lower than operation voltages of the NOR dynamic circuit and the NAND dynamic circuit.

According to the above-mentioned configuration, the amplitude of a clock can be made lower, and low power consumption can be realized It is preferable that the first and second semiconductor integrated circuits include a second NOR dynamic circuit, and an inverter in which an input terminal is connected to a third output node of the second NOR dynamic circuit and the second clock is supplied from an output terminal, wherein the second NOR dynamic circuit includes: a second P-type MOS transistor in which a gate is supplied with the first clock and a source is connected to a power source; a switching circuit for receiving a power source potential and a ground potential, selectively outputting the ground potential while the first output node of the NOR dynamic circuit is charged, and thereafter, selectively outputting the power source potential; a third P-type MOS transistor in which a gate is supplied with an output signal of the switching circuit, a source is grounded, and a drain is connected to a drain of the second P-type MOS transistor; and a plurality of fourth N-type MOS transistors in which a gate and a source are grounded and a drain is connected to a drain of the second P-type MOS transistor.

According to the above-mentioned configuration, a current path between the power source and the ground of the NAND dynamic circuit is cut off, and a leakage current is prevented, whereby glitches can be reduced. Accordingly, even in the case where the load capacity of the output node of the NOR dynamic circuit is large, a stable operation and low power consumption can be made possible.

In order to achieve the above-mentioned object, a third semiconductor integrated circuit of the present invention includes a first NOR dynamic circuit including: a first P-type MOS transistor in which a gate is supplied with a first clock (CLK1) and a source is connected to a power source; a first switching circuit for receiving a ground potential and a plurality of first data (A, B, C, D), selectively outputting the ground potential while the first output node is charged, and thereafter, selectively outputting the plurality of data; and a plurality of first N-type MOS transistors in which gates are supplied with an output signal of the first switching circuit, sources are grounded, and drains are connected to a drain of the first P-type MOS transistor, whereby the first output node is formed, in order to receive the first clock and the plurality of first data, to hold the charge of the first output node in a case where during one of a period from rising to falling of the first dock and a period from falling to rising of the first clock, the first output node is charged, and during the other period, all the plurality of first data are matched with each other, and to discharge the first output node in a case where at least one of the plurality of first data is not matched The third semiconductor integrated circuit of the present invention also includes a NAND dynamic circuit for receiving a second clock (CLK2, CLK3) and a signal from the first output node, holding a charge of a second output node in a case where during one of a period from rising to falling of the second dock and a period from falling to rising of the second dock, the first output node is discharged, and discharging the second output node in a case where the charge of the first output node is held. The third semiconductor integrated circuit of the present invention also includes a second NOR dynamic circuit including: a second P-type MOS transistor in which a gate is supplied with the first clock, and a source is connected to a power source; a second switching circuit for receiving a power source potential and a ground potential, selectively outputting the ground potential while the first output node of the first NOR dynamic circuit is charged, and thereafter, selectively outputting the power source potential; a second N-type MOS transistor in which a gate is supplied with an output signal from the second switching circuit, a source is grounded and a drain is connected to a drain of the second P-type MOS transistor; and a plurality of third N-type MOS transistors in which a gate and a source are grounded and a drain is connected to a drain of the second P-type MOS transistor. The third semiconductor integrated circuit of the present invention also includes an inverter in which an input terminal is connected to the third output node of the second NOR dynamic circuit and the second clock (CLK3) is supplied from an output terminal. In the third semiconductor integrated circuit of the present invention, the plurality of first N-type MOS transistors constituting the first NOR dynamic circuit, and the second N-type MOS transistor and the plurality of third N-type MOS transistors constituting the second NOR dynamic circuit are formed as one circuit block on a semiconductor substrate, and the plurality of first N-type MOS transistors, and the second N-type MOS transistor and the plurality of third N-type MOS transistors are formed in a direction lateral to other adjacent circuit blocks so that diffusion regions constituting sources and drains thereof, and gate electrodes thereof are formed successively, and in the one circuit block, diffusion regions constituting drains of the plurality of first N-type MOS transistors or drains of the second N-type MOS transistor and the plurality of third N-type MOS transistors are formed on an outer side.

In the third semiconductor integrated circuit, it is preferable that in a case where characteristics of diffusion regions are degraded due to a shallow trench insulator (STI) formed between the diffusion regions and the other adjacent circuit blocks, the diffusion regions constituting the drains of the second N-type MOS transistor and the plurality of third N-type MOS transistors are formed on an outer side. Alternatively, it is preferable that in a case where characteristics of diffusion regions are improved due to a shallow trench insulator formed between the diffusion regions and the other adjacent circuit blocks, the diffusion regions constituting the drains of the plurality of first N-type MOS transistors are formed on an outer side.

According to the above-mentioned configuration, in the case where characteristics of the diffusion regions are degraded when the STI is formed, diffusion regions (dummy drain "dm") to be provided as dummies, constituting the drains of the second or third N-type MOS transistors, are formed on an outer side, whereby the degradation of transistor characteristics is compensated. Alternatively, in the case where characteristics of the diffusion regions are improved when the STI is formed, diffusion regions ("d") constituting the drains of a plurality of first N-type MOS transistors are formed on an outer side, whereby transistor characteristics can be enhanced. Because of this, reduction of glitches and lower power consumption can be realized with satisfactory transistor characteristics. Furthermore, the number of inserted dummy gates to be provided as dummies of the second or third N-type MOS transistors can be reduced, and the cell area can be reduced.

In the third semiconductor integrated circuit, it is preferable that diffusion regions constituting sources further are formed on an outer side of the diffusion regions constituting the drains of the plurality of first N-type MOS transistors, or the drains of the second N-type MOS transistor and the plurality of third N-type MOS transistors.

According to the above-mentioned configuration, the number of insertions of dummy gates of the second N-type MOS transistor and the plurality of third N-type MOS transistors becomes equal to the number of gates of the plurality of first N-type MOS transistors that receive a plurality of data A, B, C, and D. This reduces the influence of a miniaturization process (i.e., influence of degeneration of diffusion regions), and lacing due to a signal delay between the drain "d" and the dummy drain "dm".

In order to achieve the above-mentioned object, a fourth semiconductor integrated circuit of the present invention includes: a plurality of first NOR dynamic circuits each including: a first P-type MOS transistor in which a gate is supplied with a first clock (CLK1) and a source is connected to a power source; a first switching circuit for receiving a ground potential and a plurality of first data (A1, B1; A2, B2; A3, B3), selectively outputting the ground potential while the first output node is charged, and thereafter, selectively outputting the plurality of data; and a plurality of first N-type MOS transistors in which gates are supplied with an output signal of the first switching circuit, sources are grounded and drains are connected to a drain of the first P-type MOS transistor, whereby the first output node is formed, in order to receive the first clock and the plurality of first data, to hold the charge of the first output node in a case where during one of a period from rising to falling of the first clock and a period from falling to rising of the first clock, the first output node is charged, and during the other period, all the plurality of first data are matched with each other, and to discharge the first output node in a case where at least one of the plurality of first data is not matched. The fourth semiconductor integrated circuit of the present invention also includes a plurality of NAND dynamic circuits for receiving a second clock (CLK2, CLK3) and a signal from the first output node, holding a charge of a second output node in a case where during one of a period from rising to falling of the second clock and a period from falling to rising of the second clock, the first output node is discharged, and discharging the second output node in a case where the charge of the first output node is held. The fourth semiconductor integrated circuit of the present invention also includes a plurality of second NOR dynamic circuits each including: a second P-type MOS transistor in which a gate is supplied with the first clock and a source is connected to a power source; a second switching circuit for receiving a power source potential and a ground potential, selectively outputting the ground potential while the first output node of the first NOR dynamic circuit is charged, and thereafter, selectively outputting the power source potential; a second N-type MOS transistor in which a gate is supplied with an output signal from the second switching circuit, a source is grounded and a drain is connected to a drain of the second P-type MOS transistor; and a plurality of third N-type MOS transistors in which a gate and a source are grounded and a drain is connected to a drain of the second P-type MOS transistor. The fourth semiconductor integrated circuit of the present invention also includes an inverter in which an input terminal is connected to the third output node of the second NOR dynamic circuit, and the second clock (CLK3) is supplied from an output terminal. In the fourth semiconductor integrated circuit of the present invention, a first circuit block in which the plurality of first N-type MOS transistors constituting the first NOR dynamic circuit are provided, and a second circuit block in which the second N-type MOS transistor and the plurality of third N-type MOS transistors constituting the second NOR dynamic circuit are provided, are formed on a semiconductor substrate so that diffusion regions constituting sources and drains thereof and gate electrodes thereof are formed successively in a direction longitudinal to other adjacent circuit blocks, and the first circuit block and the second circuit block are formed in a lateral direction at an equal interval, and arrangement of the first circuit block and the second circuit block is varied depending upon a distance with respect to the other adjacent circuit blocks.

According to the above-mentioned configuration, degradation and non-uniformity of the diffusion regions are eliminated, and lacing caused by a signal delay between the drains "d" of a plurality of first N-type MOS transistors and dummy drains "dm" to be provided as dummies of a second N-type MOS transistor and a plurality of third N-type MOS transistors can be reduced.

In the fourth semiconductor integrated circuit, it is preferable that in a case where characteristics of the diffusion regions in the first or second circuit block are degraded due to a shallow trench insulator formed between the diffusion regions and the other adjacent circuit blocks, the second circuit block is disposed on a side at a shorter distance from the other adjacent circuit block.

According to the above-mentioned configuration, in the case where characteristics of the diffusion regions are degraded by the STI formed in a region at a small interval with respect to the other circuit block, a second circuit block to be provided as a dummy is disposed in that region, whereby the characteristics of the diffusion regions in the first circuit block that in receives a plurality of data can be prevented from being degraded.

Alternatively, in the fourth semiconductor integrated circuit, it is preferable that in a case where characteristics of the diffusion regions in the first or second circuit block are improved due to a shallow trench insulator formed between the diffusion regions and the other adjacent circuit blocks, the second circuit block is disposed on a side at a longer distance from the other adjacent circuit block.

According to the above-mentioned configuration, in the case where the characteristics of the diffusion regions are improved by the STI formed in a region having a small interval with respect to the other circuit block, the first circuit block that receives a plurality of data is disposed, and the second circuit block to be provided as a dummy is disposed at a position having a large interval with respect to the other circuit block, whereby the characteristics of the diffusion regions in the first circuit block can be enhanced.

Furthermore, in the fourth semiconductor integrated circuit, it is preferable that diffusion regions constituting sources further are formed on an outer side of the diffusion regions constituting the drains on an outer side in a longitudinal direction of the first and second circuit blocks.

According to the above-mentioned configuration, the influence of a miniaturization process (i.e., influence of degeneration of diffusion regions) can be reduced, and lacing due to a signal delay between the drain "d" and the dummy drain "dm" can be reduced.

In order to achieve the above-mentioned object, a fifth semiconductor integrated circuit of the present invention includes a plurality of first NOR dynamic circuits each including: a first P-type MOS transistor in which a gate is supplied with a first clock (CLK1) and a source is connected to a power source; a first switching circuit for receiving a ground potential and a plurality of first data (A1, B1; A2, B2), selectively outputting the ground potential while the first output node is charged, and thereafter, selectively outputting the plurality of data; and a plurality of first N-type MOS transistors in which gates are supplied with an output signal of the first switching circuit, sources are grounded and drains are connected to a drain of the first P-type MOS transistor, whereby the first output node is formed, in order to receive the first clock and the plurality of first data, to hold the charge of the first output node in a case where during one of a period from rising to falling of the first clock and a period from falling to rising of the first clock, the first output node is charged, and during the other period, all the plurality of first data are matched with each other, and to discharge the first output node in a case where at least one of the plurality of first data is not matched. The fifth semiconductor integrated circuit of the present invention also includes a plurality of NAND dynamic circuits for receiving a second dock and a signal from the first output node, holding a charge of a second output node in a case where during one of a period from rising to falling of the second clock and a period from falling to rising of the second clock, the first output node is discharged, and discharging the second output node in a case where the charge of the first output node is held. The fifth semiconductor integrated circuit of the present invention also includes a plurality of second NOR dynamic circuits each including: a second P-type MOS transistor in which a gate is supplied with the first clock and a source is connected to a power source; a second switching circuit for receiving a power source potential and a ground potential, selectively outputting the ground potential while the first output node of the first NOR dynamic circuit is charged, and thereafter, selectively outputting the power source potential; a second N-type MOS transistor in which a gate is supplied with an output signal from the second switching circuit, a source is grounded and a drain is connected to a drain of the second P-type MOS transistor; and a plurality of third N-type MOS transistors in which a gate and a source are grounded and a drain is connected to a drain of the second P-type MOS transistor. The fifth semiconductor integrated circuit of the present invention also includes an inverter in which an input terminal is connected to the third output node of the second NOR dynamic circuit and the second clock is supplied from an output terminal. In the fifth semiconductor integrated circuit of the present invention, among the plurality of first NOR dynamic circuits, the plurality of first N-type MOS transistors constituting each of two first NOR dynamic circuits adjacent in a direction longitudinal to other adjacent circuit blocks are formed on a semiconductor substrate as one circuit block so as to share the second N-type MOS transistor, the plurality of third N-type MOS transistors constituting one of the plurality of second NOR dynamic circuits and the plurality of first N-type MOS transistors, and the second N-type MOS transistor and the plurality of third N-type MOS transistors are formed so that diffusion regions constituting sources and drains thereof and gate electrodes thereof are formed successively in a direction longitudinal to other adjacent circuit blocks.

According to the above-mentioned configuration, two adjacent first NOR dynamic circuits that receive a plurality of data share one second NOR dynamic circuit to be provided as a dummy, whereby a cell area can be reduced and an area of the diffusion regions is increased to prevent degeneration.

In order to achieve the above-mentioned object, a sixth semiconductor integrated circuit of the present invention includes a first NOR dynamic circuit including: a first P-type MOS transistor in which a gate is supplied with a first clock (CLK1) and a source is connected to a power source; a first switching circuit for receiving a ground potential and a plurality of first data (ADR [0–4]), selectively outputting the ground potential while the first output node is charged, and thereafter, selectively outputting the plurality of data; and a plurality of first N-type MOS transistors in which gates are supplied with an output signal of the first switching circuit, sources are grounded, and drains are connected to a drain of the first P-type MOS transistor, whereby the first output node is formed, in order to receive the first clock and the plurality of first data, to hold the charge of the first output node in a case where during one of a period from rising to falling of the first clock and a period from falling to rising of the first dock, the first output node is charged, and during the other period, all the plurality of first data are matched with each other, and to discharge the first output node in a case where at least one of the plurality of first data is not matched. The sixth semiconductor integrated circuit of the present invention also includes a NAND dynamic circuit for receiving a second clock (CLK2, CLK3) and a signal from the first output node, holding a charge of a second output node in a case where during one of a period from rising to falling of the second clock and a period from falling to rising of the second clock, the first output node is discharged, and discharging the second output node in a case where the charge of the first output node is held. The sixth semiconductor integrated circuit of the present invention also includes a second NOR dynamic circuit including: a second P-type MOS transistor in which a gate is supplied with the first clock, and a source is connected to a power source; a second switching circuit for receiving a power source potential and a ground potential, selectively outputting the ground potential while the first output node of the first NOR dynamic circuit is charged, and thereafter, selectively outputting the power source potential; a second N-type MOS transistor in which a gate is supplied with an output signal from the second switching circuit, a source is grounded, a drain is connected to a drain of the second P-type MOS transistor; and a plurality of third N-type MOS transistors in which a gate and a source are grounded and a drain is connected to a drain of the second P-type MOS transistor. The sixth semiconductor integrated circuit of the present invention also includes a first inverter in which an input terminal is connected to the third output node of the second NOR dynamic circuit and the second clock is supplied from an output terminal. The sixth semiconductor integrated circuit of the present invention also includes a compensating circuit for compensating for a voltage drop of the first output node, which is caused by a coupling capacitance formed between the first output node and the second output node, occurring when the second output node is discharged while the charge of the first output node is held. In the sixth semiconductor integrated circuit of the present invention, the compensating circuit includes: a third P-type MOS transistor in which a gate is connected to the second output node and a source is connected to a power source; a fourth P-type MOS transistor in which a source is connected to a drain of the third P-type MOS transistor and a drain is connected to the first output node; and a second inverter in which an input terminal is connected to a drain of the fourth P-type MOS transistor and an output terminal is connected to a gate of the fourth P-type MOS transistor.

According to the above-mentioned configuration, the compensating circuit for compensating for a voltage drop of the output node of the first NOR dynamic circuit due to a coupling capacitance and the first NOR dynamic circuit that functions as a dummy delay circuit are provided. Because of this, an operation speed can be increased and a current path between the power source and the ground of the NAND dynamic circuit is cut off, thereby reducing a leakage current and glitches. Even in the case where the load capacity of the output node of the NOR dynamic circuit is large, a stable operation can be realized at a lower voltage and lower power consumption can be realized.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative embodiments with reference to the drawings.

Embodiment 1

Figure 1:
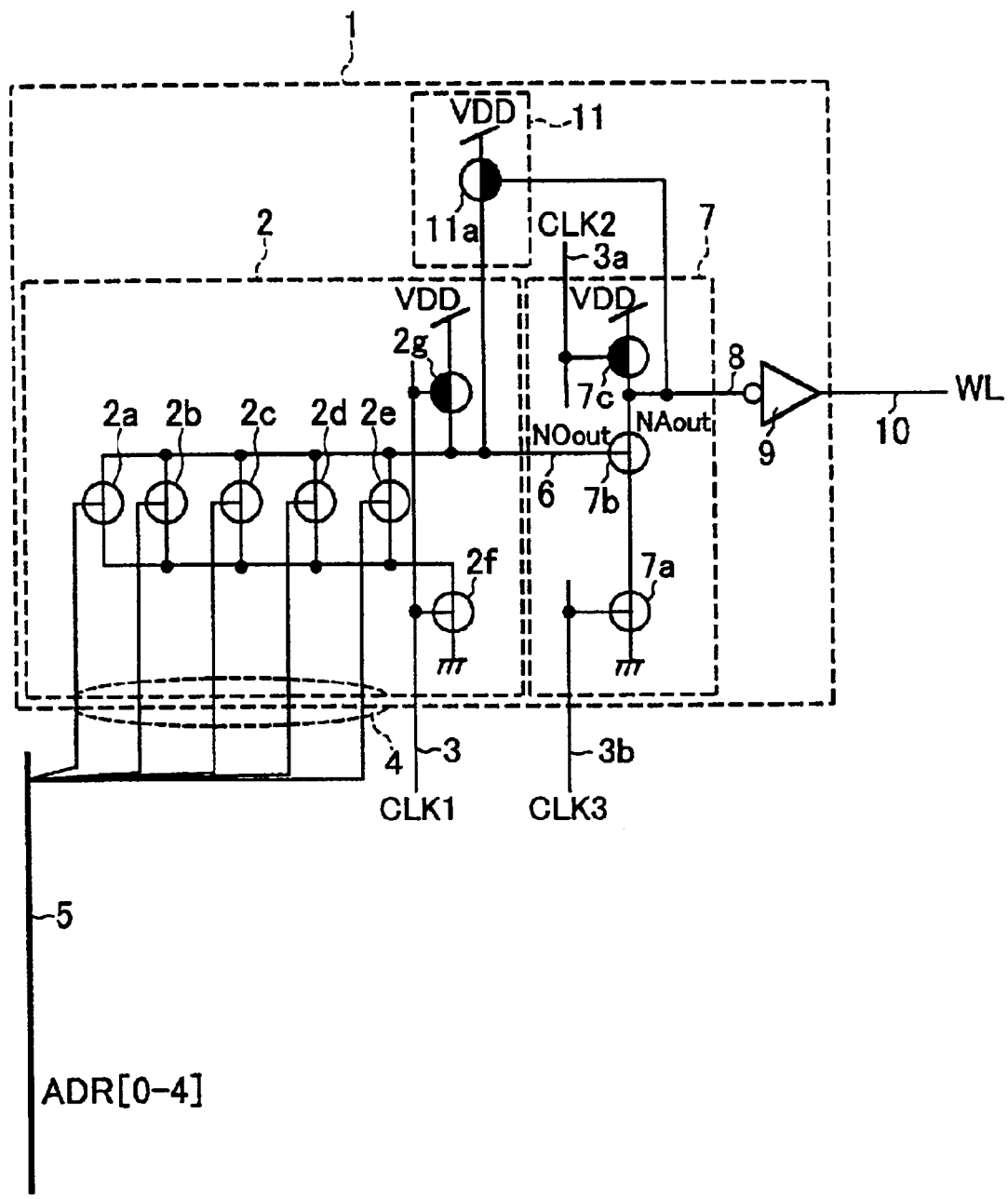
FIG. 1 is a circuit diagram showing an exemplary configuration of a semiconductor integrated circuit of Embodiment 1 according to the present invention.

FIG. 1 is a circuit diagram showing an exemplary configuration of a semiconductor integrated circuit of Embodiment 1 according to the present invention. In FIG. 1, reference numeral 1 denotes a configuration of one row of a row decoder in a SRAM memory. Reference numeral 2 denotes a NOR dynamic circuit that is synchronized with a clock (first dock: CLK1) of a clock line 3, and is composed of N-type MOS transistors 2a, 2b, 2c, 2d, 2e, 2f, and a P-type MOS transistor 2g. Reference numeral 4 denotes an input portion of the NOR dynamic circuit 2, which connects gates of the N-type MOS transistors 2a, 2b, 2c, 2d, and 2e to a 5-bit address line [0–4] 5. Reference numeral 6 denotes an output node of the NOR dynamic circuit 2, and is connected to a NAND dynamic circuit 7. The NAND dynamic circuit 7 is synchronized with clocks (second clocks: CLK2 and CLK3) of clock lines 3a and 3b. An output node 8 of the NAND dynamic circuit 7 is pre-charged in accordance with the clock CLK2, and the output node 8 of the NAND dynamic circuit 7 is discharged in accordance with the clock CLK3.

The output node 8 of the NAND dynamic circuit 7 is connected to an inverter 9, and an output terminal of the inverter 9 is connected to a word line of a memory. Furthermore, reference numeral 11 denotes a compensating circuit, which receives a signal of the output node 8 and supplies the output signal to the output node 6. The compensating circuit 11 is composed of a P-type MOS transistor 11a. The gate of the P-type MOS transistor 11a is supplied with a signal of the output node 8. The source of the P-type MOS transistor 11a is connected to a power source VDD. The P-type MOS transistor 11a supplies an output signal to the output node 6 through the drain.

Figure 2:
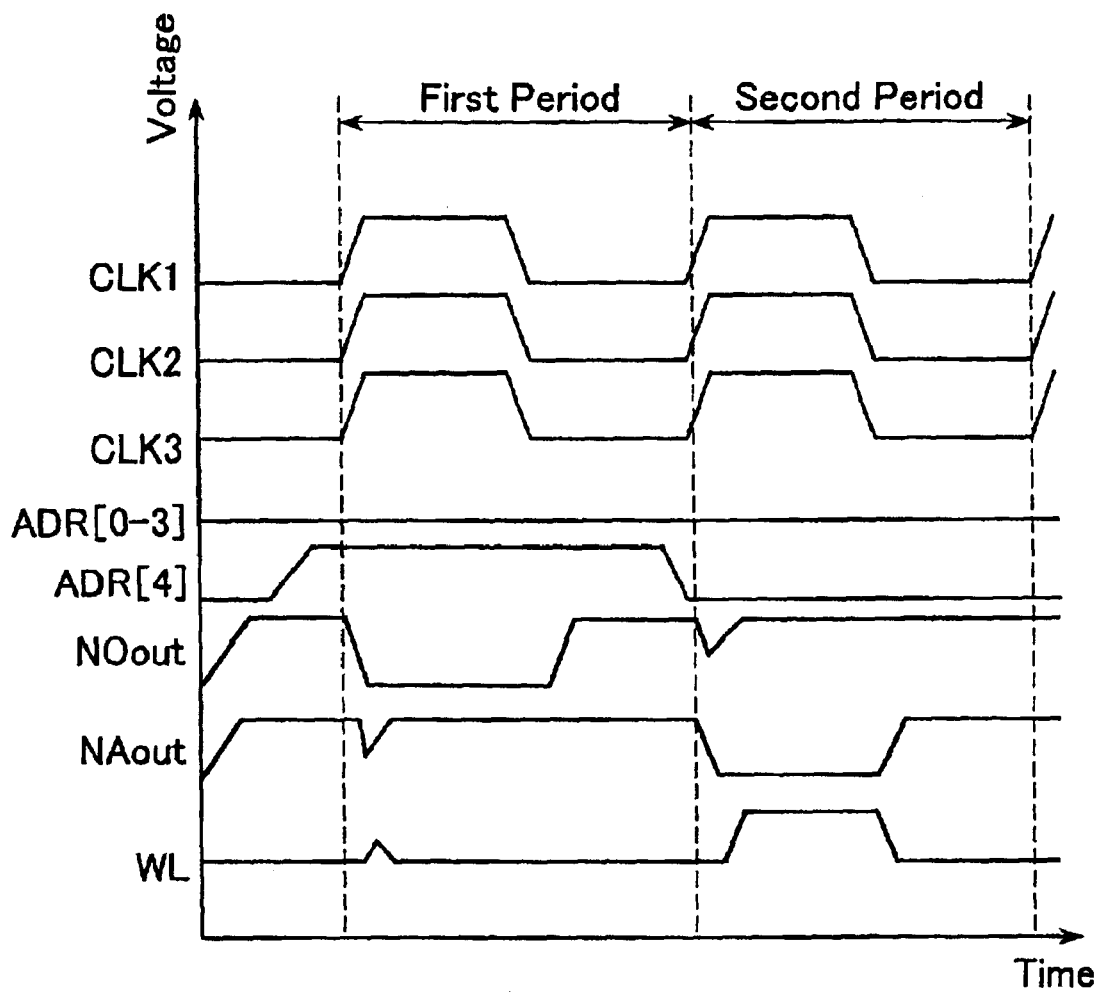
FIG. 2 is a timing chart of signals of respective portions in FIG. 1.

FIG. 2 is a timing chart of signals of respective portions in the configuration in FIG. 1, showing a transition state of the dock CLK1 of the clock line 3, the clock CLK2 of the clock line 3a, the clock CLK3 of the clock line 3b, address signals ADR [0–3] and ADR [4] of the address line [0–4] 5, a signal NOout of the output node 6 of the NOR dynamic circuit 2, a signal NAout of the output node 8 of the NAND dynamic circuit 7, and a signal WL of the word line 10.

Next, an operation of the semiconductor integrated circuit of the present embodiment will be described with reference to FIGS. 1 and 2. In the first period of the clock CLK1, the signal WL of the word line 10 is not fixed. While the clock CLK1 before the first period is at a logic "L" level, the address signals ADR [0–3] are fixed at a logic [L] level, and the address signal ADR [4] is fixed at a logic [H] level. Thereafter, when the clock CLK1 rises, the signal NOout of the output node 6 of the NOR dynamic circuit 2 transitions to a logic "L" level. The signal NAout of the output node 8 of the NAND dynamic circuit 7 keeps the logic "H" level, and the signal WL of the word line 10 becomes a logic "L" level.

In the second period of the clock CLK1, the signal WL of the word line 10 is fixed. While the clock CLK1 before the second period is at a logic "L" level, the signal NOout of the output node 6 of the NOR dynamic circuit 2 and the signal NAout of the output node 8 of the NAND dynamic circuit 7 are charged to be a logic "H" level by the transistor 2g. Next, when all the address signals ADR [0–4] of the input portion 4 are fixed at 0 V, and then, the clock CLK1 rises, the signal NOout of the output node 6 of the NOR dynamic circuit 2 keeps a logic "H" level, the signal NAout of the output node 8 of the NAND dynamic circuit 7 transitions to a logic "L" level, and the signal WL of the word line 10 becomes a logic "H" level.

Next, a role of the compensating circuit 11 will be described. In the case where the P-type MOS transistor 11a is not provided, the transistor 2g is turned off when the word line 10 is activated. Therefore, the output node 6 of the NOR dynamic circuit 2 is in a floated state. When the signal NAout of the output node 8 of the NAND dynamic circuit 7 transitions to a logic "L" level, a voltage level of the output node 6 is lowered due to the effect of a mirror capacitance between the output node 6 of the NOR dynamic circuit and the output node 8 of the NAND dynamic circuit 7. Then, a time required for the signal NAout of the output node 8 of the NAND dynamic circuit 7 to transition from a logic "H" level to a logic "L" level becomes long. However, by providing the P-type MOS transistor 11a as the compensating circuit 11 as in the present embodiment, while the signal NAout of the output node 8 of the NAND dynamic circuit 7 transitions from a logic "H" level to a logic "L" level, a voltage level of the output node 6 is increased, whereby increased speed can be realized without prolonging a transition time.

Because of the above-mentioned configuration of a dynamic circuit, the number of logic stages can be reduced, compared with a decoder circuit that is entirely composed of static circuits.

Furthermore, due to the NAND dynamic circuit 7, the load of a gate can be reduced, compared with the case where a static NAND circuit is provided.

Furthermore, the number of serial stages of each transistor is two or less, and hence, increased speed can be realized even at a low voltage.

Figure 3:
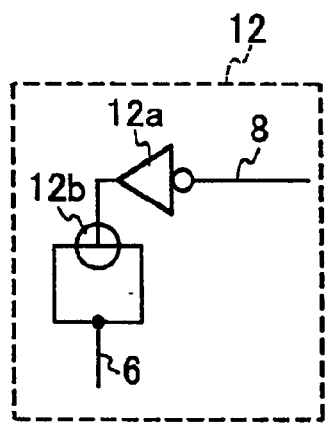
FIG. 3 is a circuit diagram showing another exemplary configuration of a compensating circuit in FIG. 1.

FIG. 3 is a circuit diagram showing another exemplary configuration of the compensating circuit. In FIG. 3, a compensating circuit 12 is composed of an inverter 12a and an N-type MOS transistor 12b, instead of the compensating circuit 11 being composed of the P-type MOS transistor 11a as shown in FIG. 1. The source and drain of the N-type MOS transistor 12b are connected to the output node 6 of the NOR dynamic circuit 2. A signal NAout of the output node 8 of the NAND dynamic circuit 7 is inverted by the inverter 12a, and supplied to the gate of the N-type MOS transistor 12b.

According to the configuration of the compensating circuit 12, a voltage drop of the output node 6 of the NOR dynamic circuit 2 can be compensated at a higher speed than that of the P-type MOS transistor 11a. The reason for this will be described below. In the case of using the P-type MOS transistor 11, a gate voltage of the P-type MOS transistor 11a and a current flowing therethrough compensates for a voltage drop of the output node 6. Therefore, the compensation amount thereof depends upon the through rate of the signal NAout of the output node 8. However, in the configuration shown in FIG. 3, by decreasing a ratio between the fan-in and fan-out of the inverter 12a, the through rate of the output of the inverter 12a can be made very steep, and the voltage of the output node 6 of the NOR dynamic circuit 2 can be raised instantaneously.

Furthermore, if an input terminal of the inverter 12a of the compensating circuit 12 is connected to the drain of the N-type MOS transistor 2f, and the source and drain of the N-type MOS transistor 12b are connected to the output node 6, a voltage drop of the output node 6 caused by a coupling capacitance between the drain of the N-type MOS transistor 2f and the output node 6 can be reduced.

Even if the N-type MOS transistor 12b is changed to a P-type MOS transistor, the same object can be achieved although the effect is slightly smaller.

In this case, by disposing another P-type MOS transistor A, connecting the source of the P-type MOS transistor A to a power source, connecting the drain of the P-type MOS transistor to the drain of the N-type MOS transistor 2f and supplying the clock CLK1 to the gate of the P-type MOS transistor A, the drain of the N-type MOS transistor 2f becomes a logic "H" level while the clock CLK1 is at a logic "L" level, whereby a leakage current of the inverter 12a can be reduced.

Figure 9A:
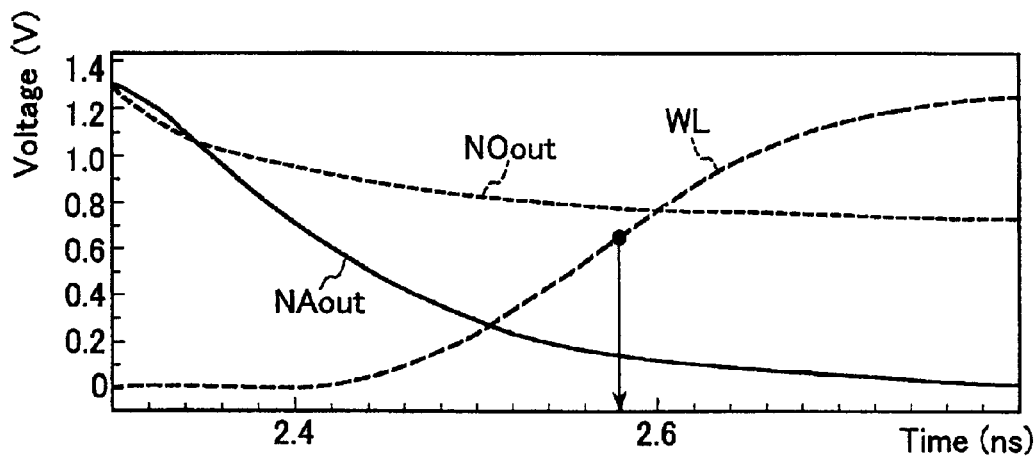
FIG. 9A is a waveform diagram showing a transition state of signals of respective portions in the absence of a compensating circuit, obtained by conducting simulation with respect to the semiconductor integrated circuit of Embodiment 1 according to the present invention.
Figure 9B:
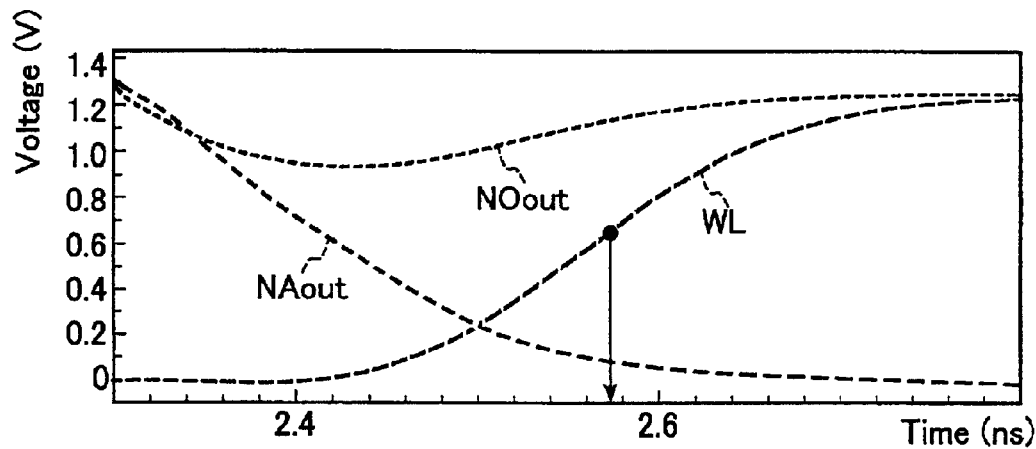
FIG. 9B is a waveform diagram showing a transition state of signals of respective portions in the presence of the compensating circuit in FIG. 1, obtained by conducting simulation with respect to the semiconductor integrated circuit of Embodiment 1 according to the present invention.
Figure 9C:
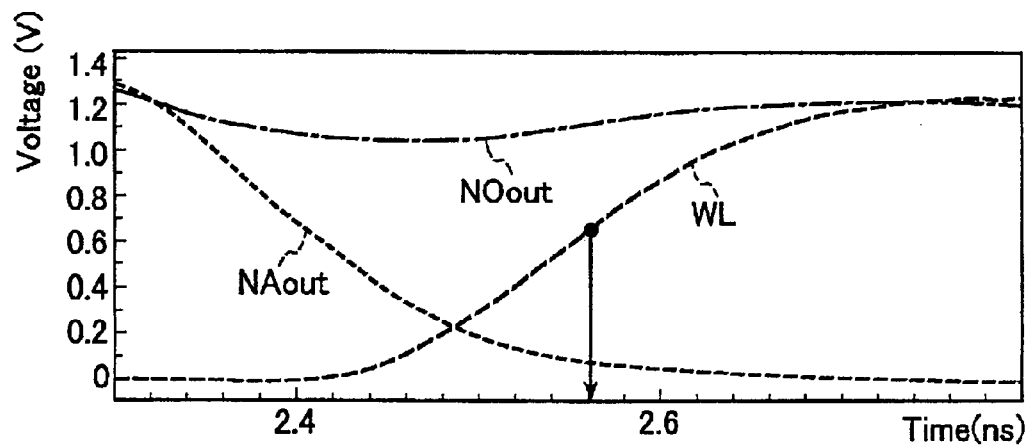
FIG. 9C is a waveform diagram showing a transition state of signals of respective portions in the presence of the compensating circuit in FIG. 3, obtained by conducting simulation with respect to the semiconductor integrated circuit of Embodiment 1 according to the present invention.

Furthermore, when the number of bits of an address is large, an output load of the NOR dynamic circuit 2 is very large and a falling time of the output signal NOout of the NOR dynamic circuit 2 is longer than a rising time of the clock CLK3 supplied to the dock line 3b, an output level of the NAND dynamic circuit 7 is decreased due to a leakage current of the output lead 8 of the NAND dynamic circuit 7. In the worst case, glitches occur in the signal WL of the word line 10, and in the configuration where a number of row decoders in SRAMs and the like are mounted, a malfunction such as multiple selection of a word line is caused. However, by setting the rising time of the clock CLK3 to be longer than the falling time of the output signal NOout of the NOR dynamic circuit 2, a leakage current of the output node 8 of the NAND dynamic circuit 7 can be prevented, and glitches of the signal WL of the word line 10 can be reduced Referring to FIGS. 9A, 9B, and 9C, the increased speed of a circuit operation in the case of using the compensating circuit 11 in FIG. 1 and the compensating circuit 12 in FIG. 3 will be verified based on circuit simulation data. FIGS. 9A to 9C show transition of the signal NOout of the output node 6 of the NOR dynamic circuit 2, the signal NAout of the output node 8 of the NAND dynamic circuit 7, and the signal WL of the word line 10, with an activated state of the word line 10 being enlarged in time. FIG. 9A shows the case in the absence of a compensating circuit. FIG. 9B shows the case where the compensating circuit 11 is provided. FIG. 9C shows the case where the compensating circuit 12 is provided.

The simulation conditions were set as follows. In FIGS. 1 and 3, a saturation current per unit width of all the N-type MOS transistors was set to be 380 µA/µm; a threshold voltage thereof was set to be 300 mV, a saturation current per unit width of all the P-type MOS transistors was set to be 160 µA/µm; a threshold voltage thereof was set to be −300 mV, a power source voltage VDD was set to be 1.3 V; and a channel length of all the transistors was set to be 0.12 µm.

Furthermore, in FIG. 1, a channel width of the N-type MOS transistors 2a, 2b, 2c, 2d, 2e, and 2f was set to be 2 µm; a channel width of the P-type MOS transistor 2g was set to be 1 µm; a channel width of the N-type MOS transistors 7a and 7b was set to be 4 µm; a channel width of the P-type MOS transistor 7c was set to be 2 µm; channel widths of the P-type MOS transistor and the N-type MOS transistor forming the inverter 9 were set to be about 8 µm and 4 µm, respectively; a load capacity of the output nodes 6 and 8 was set to be 3 fF; and a load capacity of the word line 10 was set to be 200 fF.

Furthermore, in FIG. 3, channel widths of the P-type MOS transistor and the N-type MOS transistor forming the inverter 12a were set to be 1.2 µm and 0.3 µm, respectively, and a channel width of the P-type MOS transistor 12b was set to be 2 µm.

As a result of circuit simulation under the above-mentioned setting conditions, as shown in FIG. 9A, in the absence of a compensating circuit, a voltage level of the signal NOout of the output node 6 was lowered, and a time required for the signal WL of the word line 10 to rise to a switching voltage (0.65 V) of the transistor to be connected to the word line 10 became slow. However, the following was verified. By providing the compensating circuit 11 in FIG. 1, as shown in FIG. 9B, a rising time of the signal WL of the word line 10 was shortened by about 10 psec, compared with the case in the absence of the compensating circuit. Furthermore, by providing the compensating circuit 12 in FIG. 3, as shown in FIG. 9C, a rising time of the signal WL of the word line 10 was shortened by about another 10 psec. In the present embodiment, an access speed of about 300 psec (i.e., 3 GHz of an operation frequency) sped up to 3.22 GHz by shortening a rising time by about 20 psec.

For example, when a load capacity of the word line 10 is increased by 10 times, a delay time also is increased by 10 times. Thus, the effect of the compensating circuit of the present embodiment becomes more conspicuous.

Figure 5:
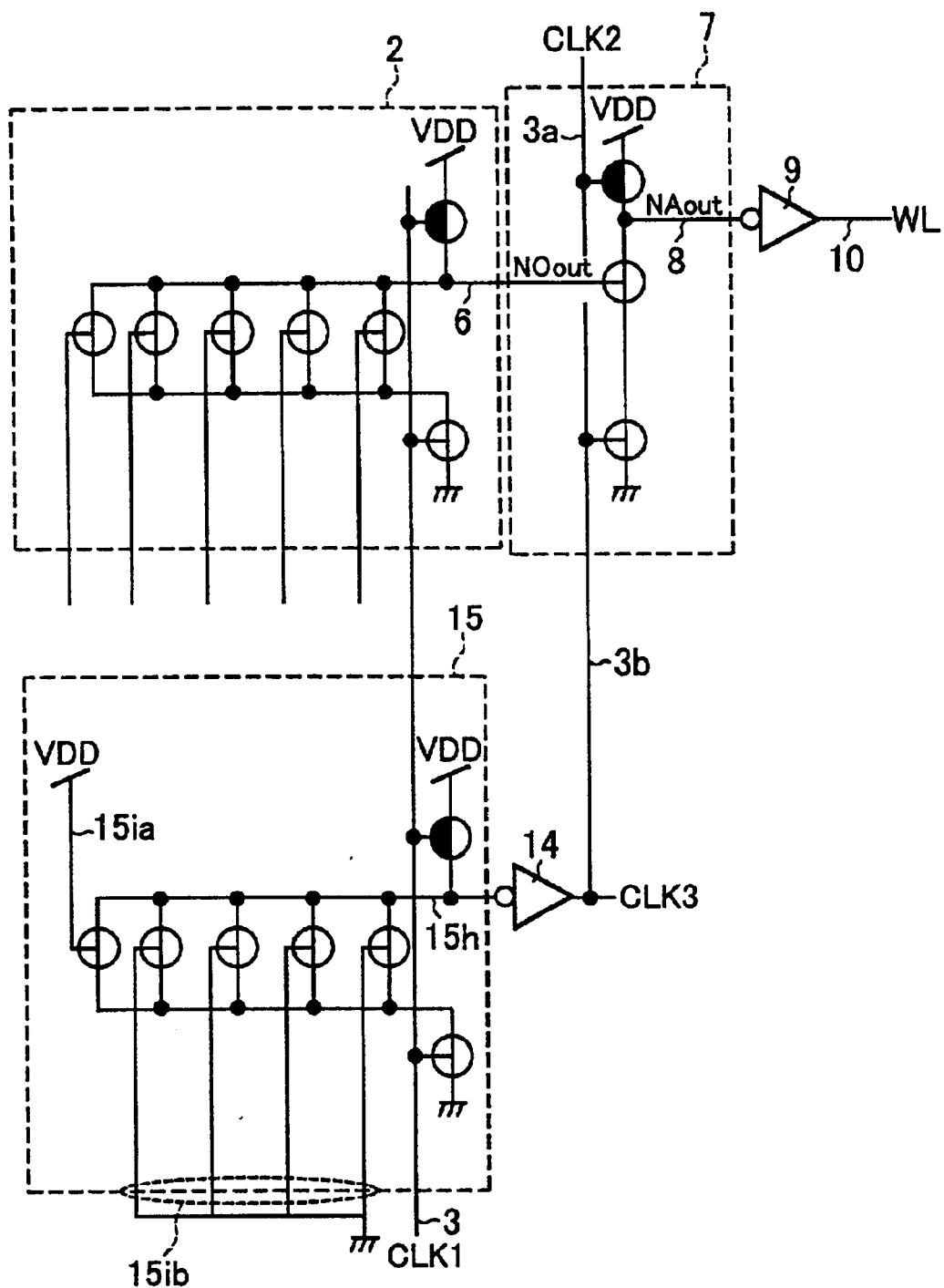
FIG. 5 is a circuit diagram showing a modified example of the semiconductor integrated circuit of Embodiment 1 according to the present invention.

FIG. 5 is a circuit diagram showing a modified example of the semiconductor integrated circuit of the present embodiment. In FIG. 5, in addition to the configuration in FIG. 1, there are provided a NOR dynamic circuit 15 that has the same configuration as that of the NOR dynamic circuit 2 and receives the same dock CLK1 as that of the NOR dynamic circuit 2, and an inverter 14 whose input terminal is connected to an output node 15h of the NOR dynamic circuit 15, and which supplies the clock CLK3 to the dock line 3b through the output terminal.

Furthermore, during activation of the semiconductor circuit shown in FIG. 5, in an input portion 15i of the NOR dynamic circuit 15, only one port 15ia among a plurality of ports is supplied with a voltage (power source VDD in FIG. 5) equal to or higher than a threshold value of the N-type MOS transistor, and the other port 15ib is grounded. The port 15ia is disposed physically away from the other port 15ib, so that the through rate of an input signal to the inverter 14 becomes smallest through the port 15ia.

Because of the above-mentioned configuration, when the clock CLK1 rises, a signal of the output node 15h transitions to a logic "L" level and the clock CLK 3 rises through the inverter 14. The NOR dynamic circuit 15 has an output load substantially equal to that of the NOR dynamic circuit 2. Therefore, the transition time of the output signal NOout of the NOR dynamic circuit 2 becomes equal to or longer than that of the output signal of the NOR dynamic circuit 15, even in the worst case. As a result, a current path between a power source—ground of the NAND dynamic circuit 7 is shut off to prevent a leakage current, whereby glitches in the signal WL of the word line can be reduced.

Furthermore, even in the case where the output load of the NOR dynamic circuit 2 is very large, it is operable only with the dock CLK1. Therefore, it is possible to obtain a configuration with higher precision compared with the case where a delay difference between the clock CLK1 and the dock CLK3 is generated by a buffer or the like, in which a lacing error is unlikely to occur.

The port 15ia need not be the one in which a through rate of an input signal to the inverter 14 becomes smallest due to the distance in terms of physical arrangement. As long as the clock CLK 3 rises after the signal NOout of the output node 6 is fixed, any port may be connected to a voltage equal to or higher than a threshold value of the N-type MOS transistor.

Figure 4:
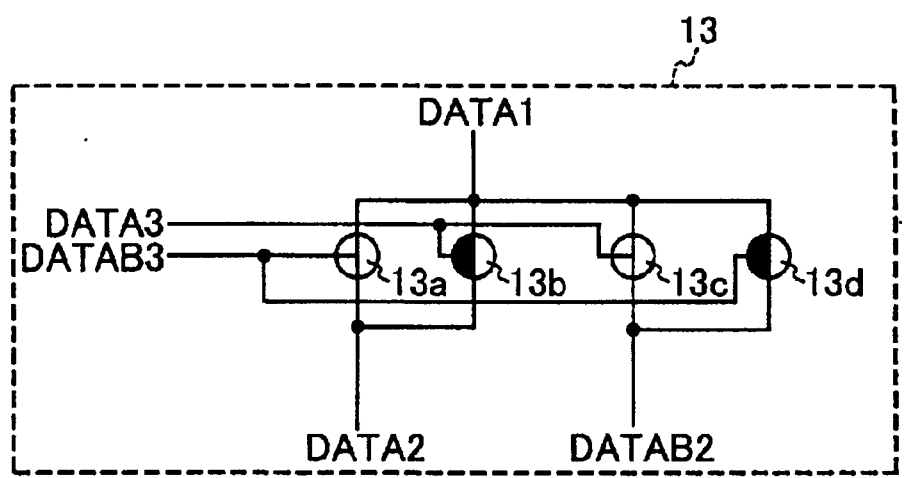
FIG. 4 is a circuit diagram showing a configuration of a matching detection circuit in Embodiment 1 according to the present invention.

In the present embodiment, the configuration of the present invention has been described mainly with respect to a row decoder. However, as shown in FIG. 4, by providing the N-type MOS transistors 13a and 13c, and the P-type MOS transistors 13b and 13d, and supplying an output signal DATA1 used for conducting detection of matching of two pairs of data groups (DATA2 and DATAB2; DATA3 and DATAB3) to the input portion 4 of the NOR dynamic circuit 2, the matching detection circuit 13 can be configured easily, and the effects similar to those as described above can be obtained.

Figure 7:
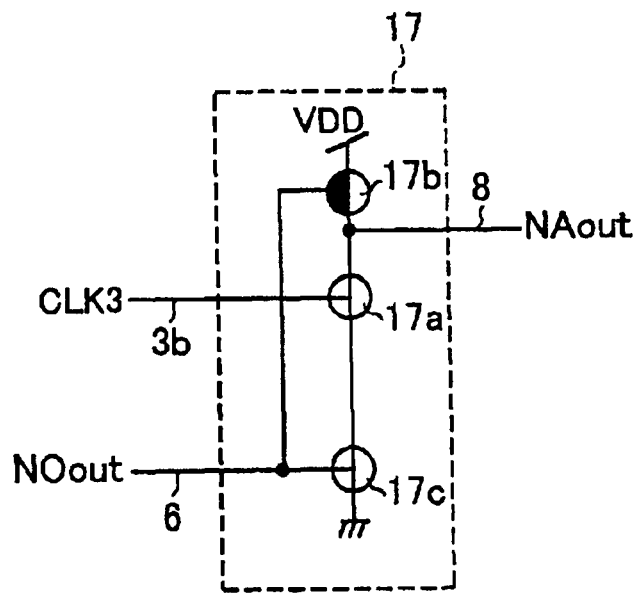
FIG. 7 is a circuit diagram showing another exemplary configuration of a NAND dynamic circuit in FIG. 1

FIG. 7 is a circuit diagram showing a configuration of the NAND dynamic circuit 17 that is another exemplary configuration of the NAND dynamic circuit 7 shown in FIG. 1.

As shown in FIG. 7, the NAND dynamic circuit 17 has a configuration in which a P-type MOS transistor 17b and an N-type MOS transistor 17c whose gates the output node 6 of the NOR dynamic circuit 2 is connected to, and an N-type MOS transistor 17a whose gate the dock CLK 3 is input to, are connected in series. The source of the P-type MOS transistor 17b is connected to the power source VDD. The drain of the P-type MOS transistor 17b and the drain of the N-type MOS transistor 17a are connected in common to form an output node 8 of the NAND dynamic circuit 17. The source of the N-type MOS transistor 17c is grounded, and the drain of the N-type MOS transistor 17c and the source of the N-type MOS transistor 17a are connected to each other.

In the case where the NAND dynamic circuit 17 is used for the decoder circuit or the matching detection circuit shown in the present embodiment, voltage levels of the dock CLK1 and the dock CLK3 may be lower than operation voltages of the NAND dynamic circuit 17 and the NOR dynamic circuit 2.

The reason for the above will be described. Even in the case where a voltage value at a logic "H" level of the clock CLK1 is low, if the ability of the P-type MOS transistor 2g in conducting pre-charge is weak and a period of a logic "H" level of the clock CLK1 is short in the NOR dynamic circuit 2, a switching level of the NAND dynamic circuit 17 will not be influenced. Furthermore, in the NAND dynamic circuit 17, the dock CLK3 only plays a role of discharging. Therefore, the voltage level of the dock CLK3 only needs to exceed a threshold value of the N-type MOS transistor 17a.

As described above, by using the NAND dynamic circuit 17 shown in FIG. 7, the amplitude of a clock can be made low, charging/discharging energy is reduced, and low power consumption can be realized in a semiconductor integrated circuit.

Figure 8:
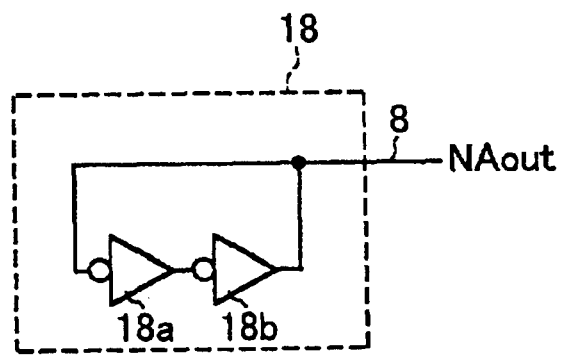
FIG. 8 is a circuit diagram showing a configuration of a positive feedback circuit in Embodiment 1 according to the present invention.

Furthermore, by connecting a positive feedback circuit 18 in which inverters 18a and 18b are connected in a two-stage cascade (as shown in FIG. 8) to the output node 8 of the NAND dynamic circuit, a signal NAout of the output node 8 of the NAND dynamic circuit is held during one period of the clock CLK3, whereby a flip-flop function can be provided.

Figure 15:
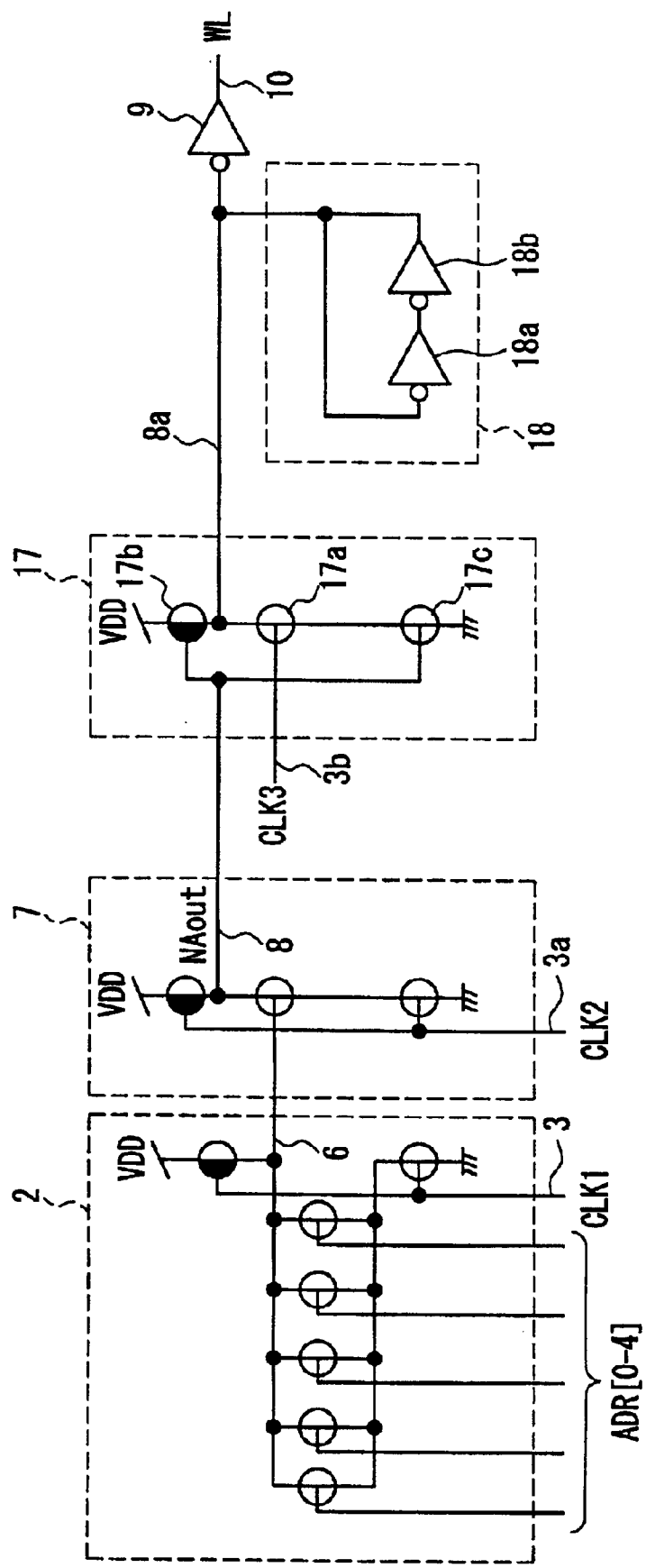
FIG. 15 is a circuit diagram showing a modified example of the semiconductor integrated circuit of Embodiment 1 according to the present invention.

Furthermore, as shown in FIG. 15, the following configuration may be possible: an input gate of the NAND dynamic circuit 7 is connected to the output node 6 of the NOR dynamic circuit 2, an input gate of the NAND dynamic circuit 17 shown in FIG. 7 is connected to the output node 8 of the NAND dynamic circuit 7, and the positive feedback circuit 18 shown in FIG. 8 is connected to the output node 8a of the NAND dynamic circuit 17. According to this configuration, the function as a flip-flop circuit for holding the address signals ADR [0–4] to the NOR dynamic circuit 2 for one period is provided. Therefore, even if the address signals ADR [04] are varied in a logic "H" level period of the clock CLK1, the signal WL of the word line 10 is not changed. That is, a hold error is reduced compared with the above-mentioned circuit configuration.

Furthermore, even in the case where an amplitude level of a clock signal is low, and voltage levels of the address signals ADR [0–4] are lower or higher than a power source voltage, the function as a kind of level shifter can be obtained, and the integrated circuit can be operated.

Figure 16:
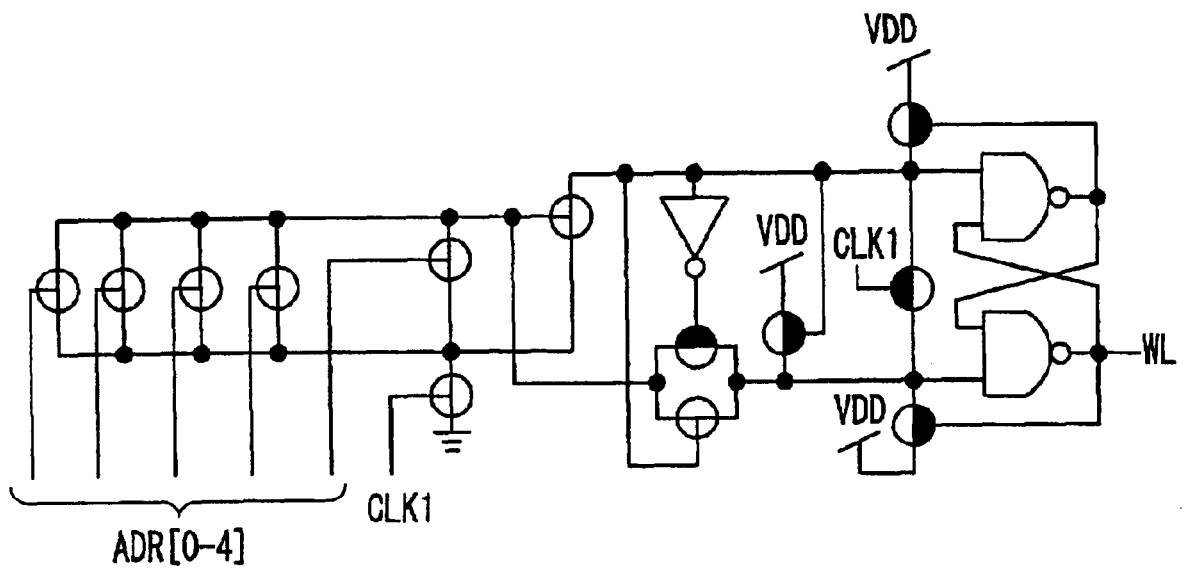
FIG. 16 is a circuit diagram showing another modified example of the semiconductor integrated circuit of Embodiment 1 according to the present invention.

Furthermore, by providing the circuit configuration as shown in FIG. 16, the load capacity of the clock CLK1 is reduced, and lower power consumption can be achieved in addition to the advantage similar to that of the circuit shown in FIG. 15.

Furthermore, the configuration in FIG. 16 has the advantage that a feedback switch is inserted, whereby even when an address is toggled under the condition that the clock CLK1 is in an "H" state, current leakage does not occur.

Embodiment 2

Figure 6:
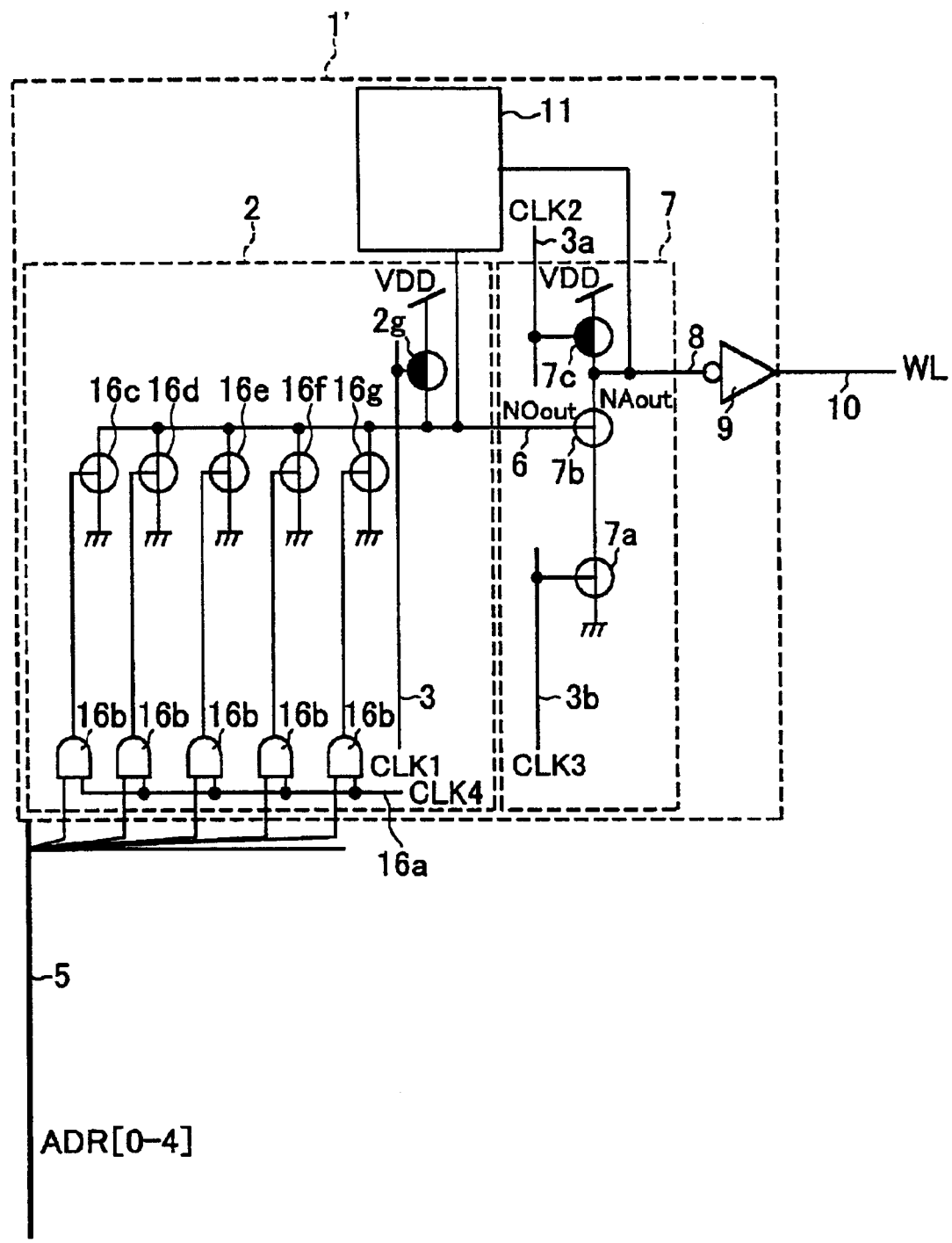
FIG. 6 is a circuit diagram showing an exemplary configuration of a semiconductor integrated circuit of Embodiment 2 according to the present invention.

FIG. 6 is a circuit diagram showing an exemplary configuration of a semiconductor integrated circuit of Embodiment 2 according to the present invention. In FIG. 6, the components with the same configuration and function as those in FIG. 1 are denoted with the same reference numerals as those therein, and the description thereof will be omitted here. The present embodiment is different from Embodiment 1 in the configuration of a NOR dynamic circuit. Hereinafter, this difference will be described.

In FIG. 6, a NOR dynamic circuit 16 includes 2-input AND circuits (switching circuits) and N-type MOS transistors 16c, 16d, 16e, 16f, and 16g. One input terminal of each 2-input AND circuit is connected to an address line [0–4] 5, and the other input terminal thereof is connected to a clock line 16a supplied with a clock CLK4 that has the same cycle as that of the clock CLK 1 and a different phase therefrom. Gates of the N-type MOS transistors 16c, 16d, 16e, 16f, and 16g are connected to output terminals of the 2-input AND circuits, sources thereof are grounded and drains thereof are connected in common to form an output node 6.

Next, an operation of a row decoder 1' will be described as a semiconductor integrated circuit configured as described above.

First, the clock CLK1 transitions from a logic "H" level to a logic "L" level. While the output node 6 is charged by the P-type MOS transistor 2g, voltages of gate terminals of the N-type MOS transistors 16c, 16d, 16e, 16f, and 16g remain at a logic "L" level. The clock CLK4 becomes a logic "L" level (control state) so that the output node 6 of the NOR dynamic circuit 16 is charged.

Thereafter, the clock CLK 4 becomes a logic "H" level, the voltages of the gate terminals of the N-type MOS transistors 16c, 16d, 16e, 16f, and 16g are changed depending upon the address signals ADR [0–4] of the address line [0–4] 5, and the output voltage of the NOR dynamic circuit 16 transitions.

Because of the above-mentioned configuration, a junction capacity of the drain of the N-type MOS transistor 2f in the NOR dynamic circuit 2 in FIG. 1, and wiring between the N-type MOS transistor 2f and the N-type MOS transistors 2a, 2b, 2c, 2d, and 2e become unnecessary. Consequently, a wiring capacity and wiring resistance are reduced, and further speed increase is made possible. Furthermore, the number of serial stages of the P-type and N-type MOS transistors is one, respectively; therefore, the NOR dynamic circuit 16 is operable at a voltage lower than that of the NOR dynamic circuit 2.

Embodiment 3

Figure 10:
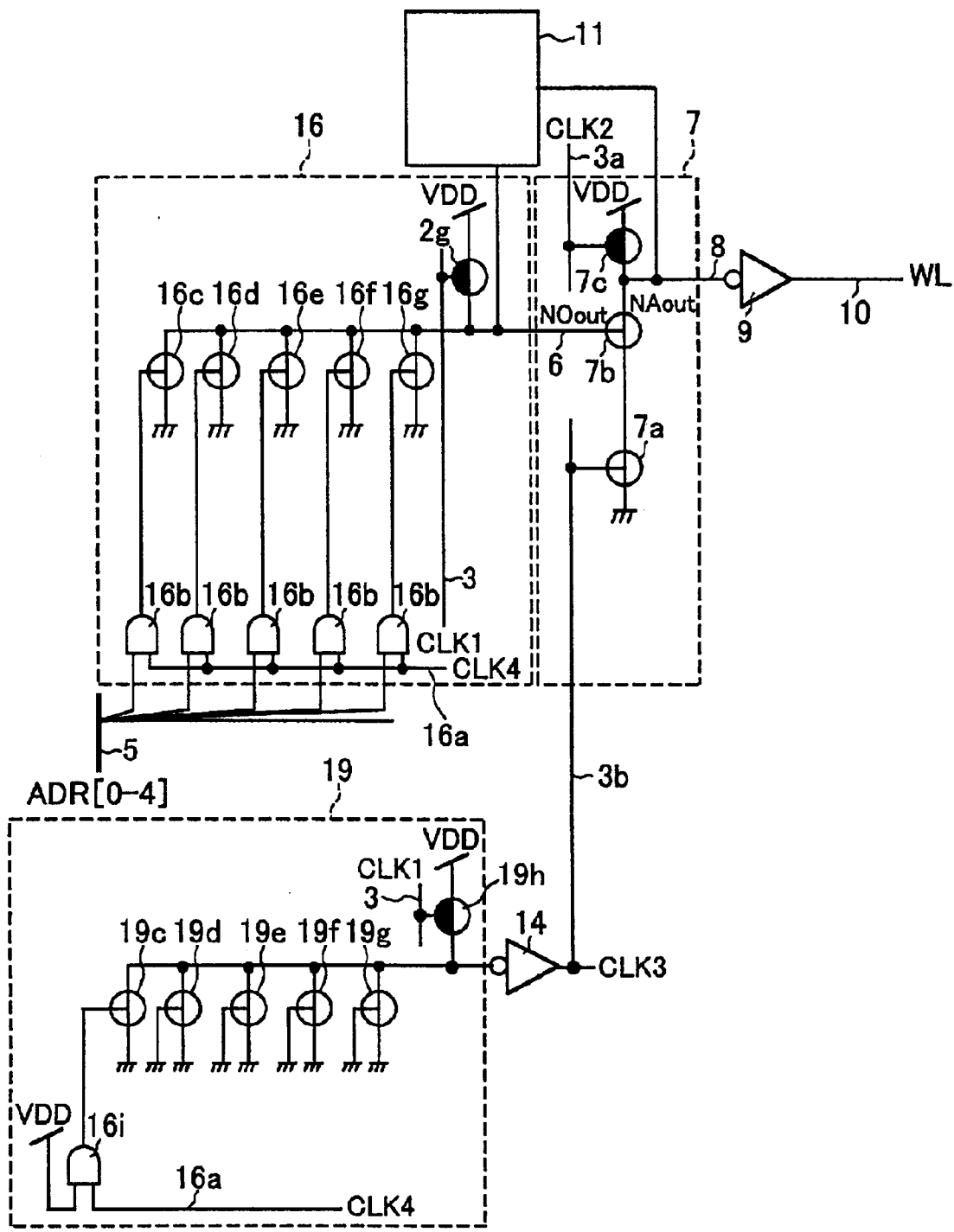
FIG. 10 is a circuit diagram showing an exemplary configuration of a semiconductor integrated circuit of Embodiment 3 according to the present invention.

Embodiment 3 of the present invention may have a configuration as shown in FIG. 10, in order to realize the same effect as that of the circuit in FIG. 5 referred to in Embodiment 1 and a lower voltage operation. In FIG. 10, reference numeral 19 denotes a NOR dynamic circuit (second NOR dynamic circuit) provided as a dummy with respect to the NOR dynamic circuit 16 (first NOR dynamic circuit). Reference numerals 19c, 19d, 19e, 19f, and 19g denote N-type MOS transistors. The sources of the N-type MOS transistors 19c, 19d, 19e, 19f, and 19g are grounded The gates of the N-type MOS transistors 19d, 19e, 19f, and 19g are grounded. The gate of the N-type MOS transistor 19c is connected to an output terminal of the 2-input AND circuit 16i (switching circuit, second switching circuit). One input terminal of the 2-input AND circuit 16i is supplied with an enable signal EN, and the other input terminal thereof is connected to a dock line 16a supplied with the clock CLK 4. Reference numeral 19h denotes a P-type MOS transistor, and 14 denotes an inverter. The source of the P-type MOS transistor 19h is connected to a power source VDD, and the gate thereof is connected to a dock line 3 supplied with the clock CLK1. The drains of the N-type MOS transistors 19c, 19d, 19e, 19f, and 19g are connected to the drain of the P-type MOS transistor 19h, and these drains are connected to an input terminal of the inverter 14. The inverter 14 outputs the clock CLK3 to the clock line 3b.

Embodiment 4

Next, a configuration of Embodiment 4 according to the present invention will be described, in which a first NOR dynamic circuit and a second NOR dynamic circuit provided as a dummy in Embodiment 3 are arranged in a lateral direction as one circuit block.

Figure 11A:
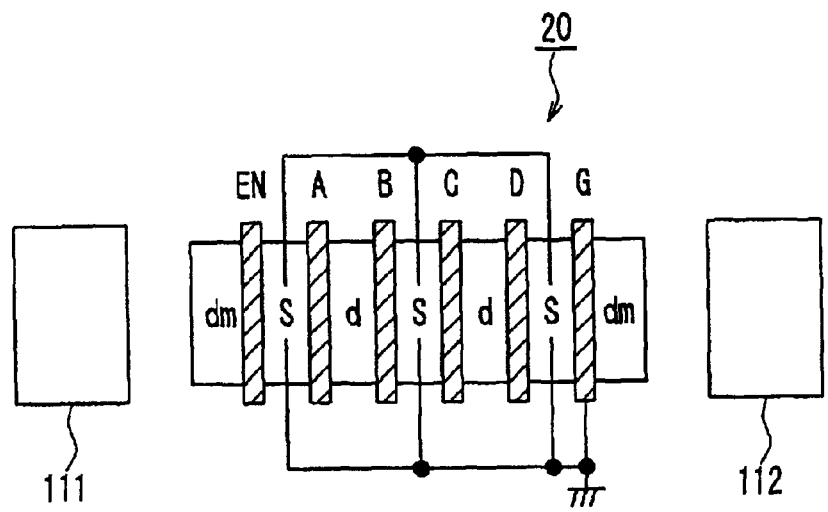
FIG. 11A is a plan view showing a part of an exemplary circuit arrangement of a semiconductor integrated circuit of Embodiment 4 according to the present invention.

FIG. 11A is a plan view showing a part of an exemplary circuit arrangement of a semiconductor integrated circuit of Embodiment 4 according to the present invention. In FIG. 11A, a first NOR dynamic circuit that receives a plurality of data A, B, C, and D, and a second NOR dynamic circuit that receives an enable signal EN and is provided as a dummy are formed on a semiconductor substrate as one circuit block 20.

Furthermore, in the circuit block 20, diffusion regions (s, d) constituting sources and drains and gate electrodes of a plurality of N-type MOS transistors (first N-type MOS transistors) that constitute a first NOR dynamic circuit, and diffusion regions (s, dm) constituting sources and dummy drains and gate electrodes of N-type MOS transistors (second and third N-type MOS transistors) that constitute a second NOR dynamic circuit are arranged in a lateral direction with respect to other adjacent circuit blocks 111 and 112.

Furthermore, as shown in FIG. 11A, in the circuit block 20, in the case where transistor characteristics are degraded by STI formed between the circuit block 20 and the other adjacent circuit blocks 111 and 112, dummy drain diffusion regions "dm" of the second and third N-type MOS transistors are formed on an outer side.

The source diffusion regions "S" are shared by the first NOR dynamic circuit and the second NOR dynamic circuit, and are connected to a ground potential G. Furthermore, in the first NOR dynamic circuit, the drain diffusion regions "d" and the source diffusion regions "s" are shared by adjacent N-type MOS transistors among a plurality of N-type MOS transistors. Because of this, the number of insertions of dummy gates of the second and third N-type MOS transistors provided as dummies can be reduced, and a cell area can be reduced.

Figure 11B:
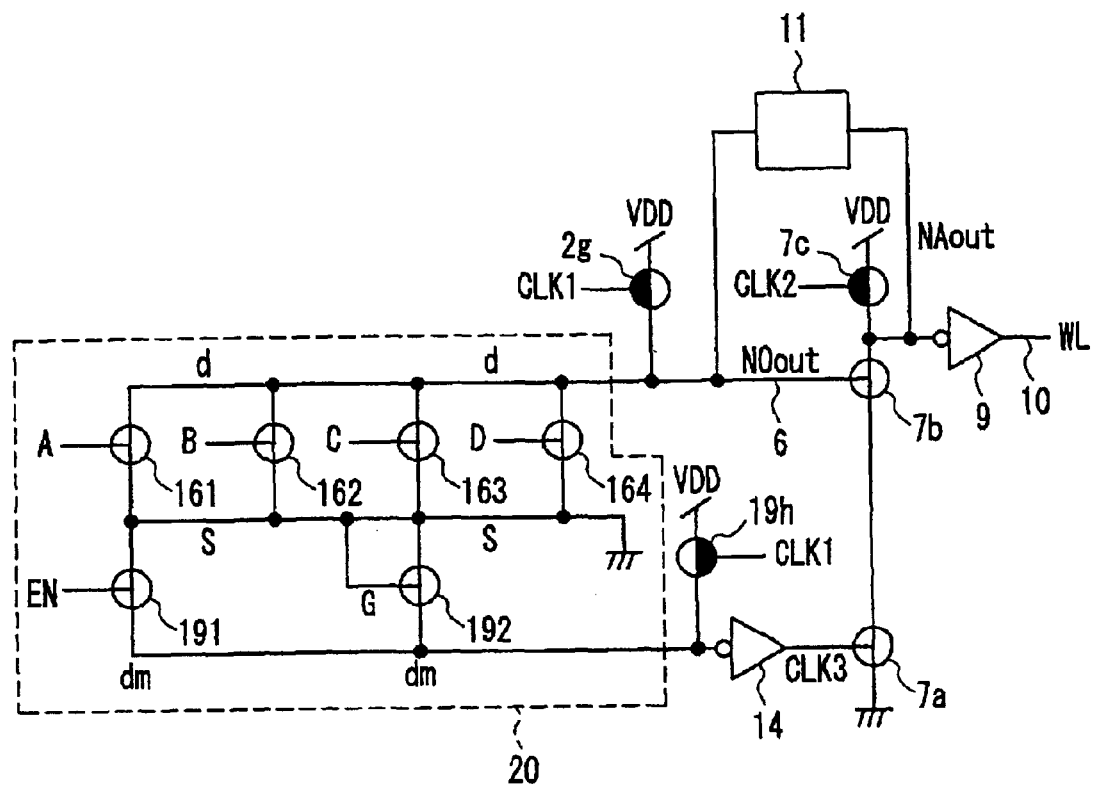
FIG. 11B is a circuit diagram showing an exemplary configuration of the semiconductor integrated circuit of Embodiment 4 according to the present invention.

FIG. 11B is a circuit diagram showing an exemplary configuration of a semiconductor integrated circuit of Embodiment 4 according to the present invention. In FIG. 11B, the components with the same configuration and function as those in FIG. 10 are denoted with the same reference numerals as those therein.

In FIG. 11B, a first NOR dynamic circuit is composed of N-type MOS transistors 161, 162, 163, and 164, and a second NOR dynamic circuit is composed of N-type MOS transistors 191 and 192.

Figure 12A:
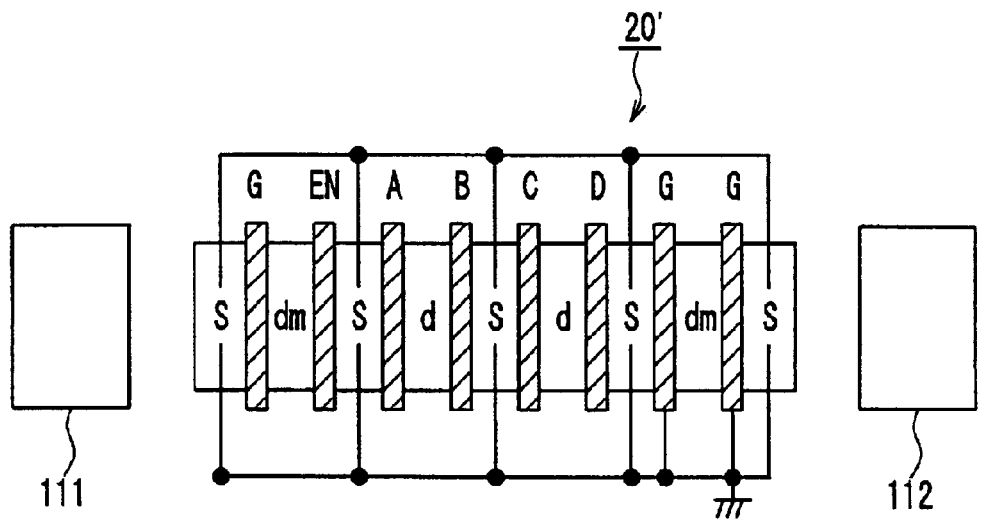
FIG. 12A is a plan view showing a part of a modified example of a circuit arrangement of a semiconductor integrated circuit of Embodiment 4 according to the present invention.
Figure 12B:
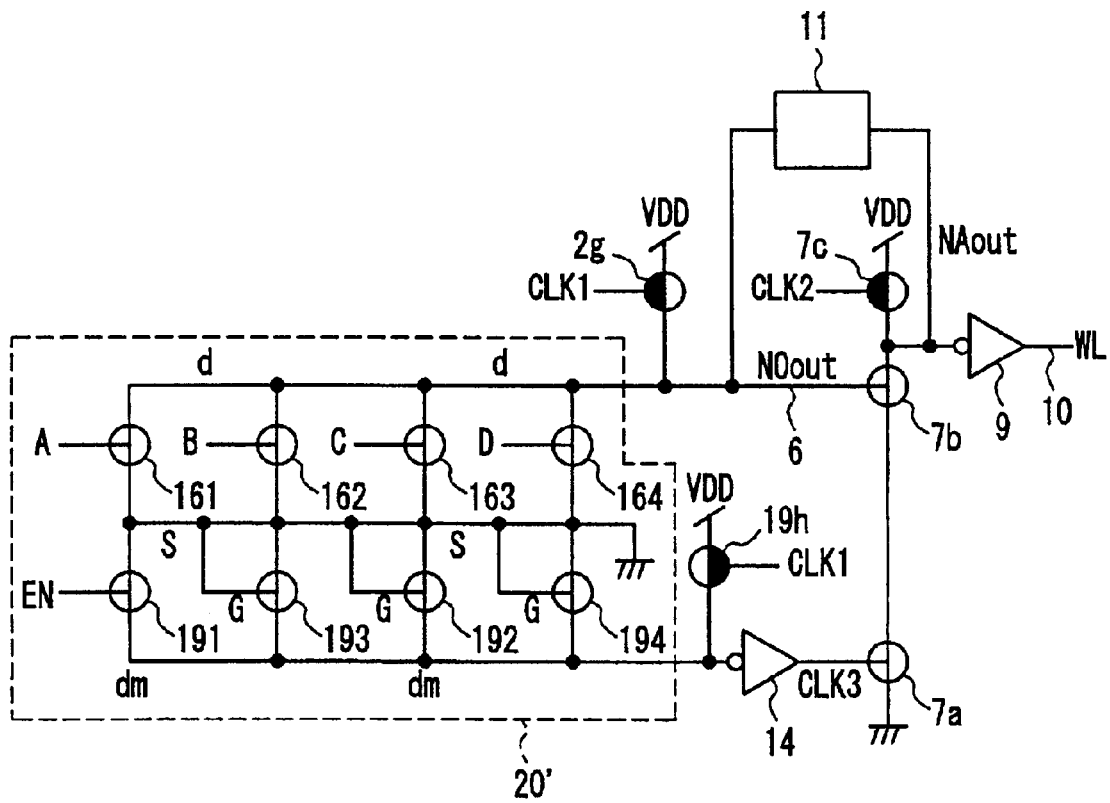
FIG. 12B is a circuit diagram showing a modified example of a configuration of the semiconductor integrated circuit of Embodiment 4 according to the present invention.

FIG. 12A is a plan view showing a part of a modified example of a circuit arrangement of the semiconductor integrated circuit of Embodiment 4 according to the present invention. FIG. 12B is a circuit diagram showing a modified example of a configuration of the semiconductor integrated circuit of Embodiment 4 according to the present invention. In FIGS. 12A and 12B, the components with the same configuration and function as those in FIGS. 11A and 11B are denoted with the same reference numerals as those therein.

As shown in FIG. 12A, in a circuit block 20', dummy source diffusion regions "s" and dummy gate electrodes are formed on an outer side of the dummy drain diffusion regions "d", and are connected in common to a ground potential G. The additional dummy source diffusion regions "s", the dummy gate electrodes, and the dummy drain diffusion regions "dm" constitute dummy N-type MOS transistors 193 and 194, as shown in FIG. 12B.

Because of this, the number of insertions of dummy gates of the second and third N-type MOS transistors become the same as the number of gates of the first N-type MOS transistor. However, this reduces the influence of a miniaturization process (i.e., influence of degeneration of diffusion regions), and lacing due to a signal delay between the drain "d" and the dummy drain "dm".

As described above, according to the present embodiment, in the case where transistor characteristics are degraded due to STI formed between the circuit block and the other adjacent circuit blocks, by forming the dummy drain diffusion regions "dm" of the second and third N-type MOS transistors on an outer side, the degradation of transistor characteristics (decrease in current ability, increase in threshold voltage, and the like) can be compensated. Because of this, reduction of glitches and lower power consumption can be realized with satisfactory transistor characteristics.

In the present embodiment, based on the fact that transistor characteristics are degraded mostly by STI formed between the circuit block and the other adjacent circuit blocks, the case where the dummy drain diffusion regions "dm" of the second and third N-type MOS transistors are formed on an outer side has been illustrated and described. However, considering the case where transistor characteristics may be improved by STI formed between the circuit block and the other adjacent circuit blocks, by forming the drain diffusion regions "d" of the first N-type MOS transistors on an outer side, transistor characteristics can be enhanced.

Embodiment 5

Next, Embodiment 5 of the present invention will be described, in which the first NOR dynamic circuit and the second NOR dynamic circuit provided as a dummy in Embodiment 3 are disposed in a longitudinal direction as separate circuit blocks.

Figure 13A:
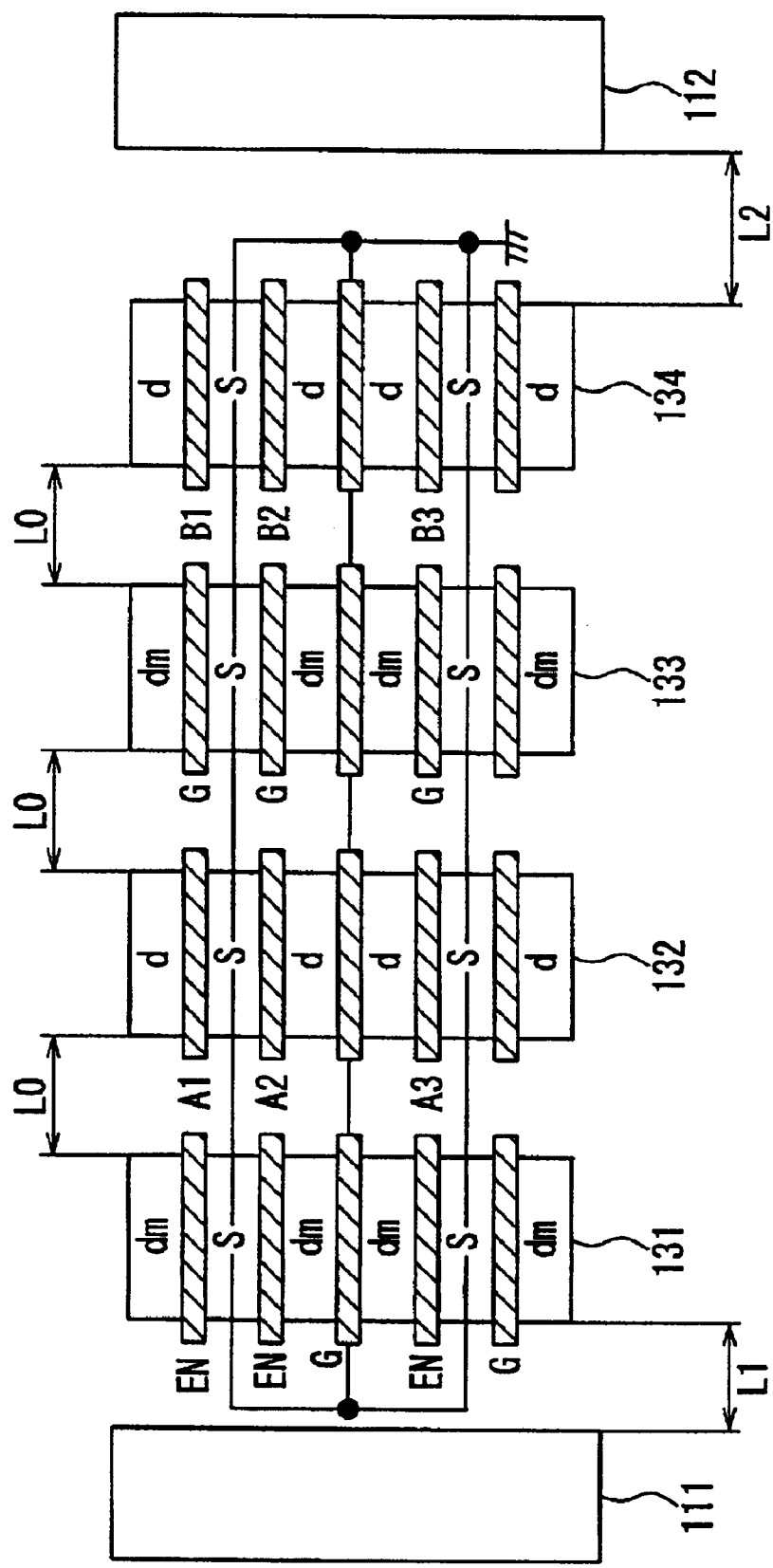
FIG. 13A is a plan view showing a part of an exemplary circuit arrangement of a semiconductor integrated circuit of Embodiment 5 according to the present invention.
Figure 13B:
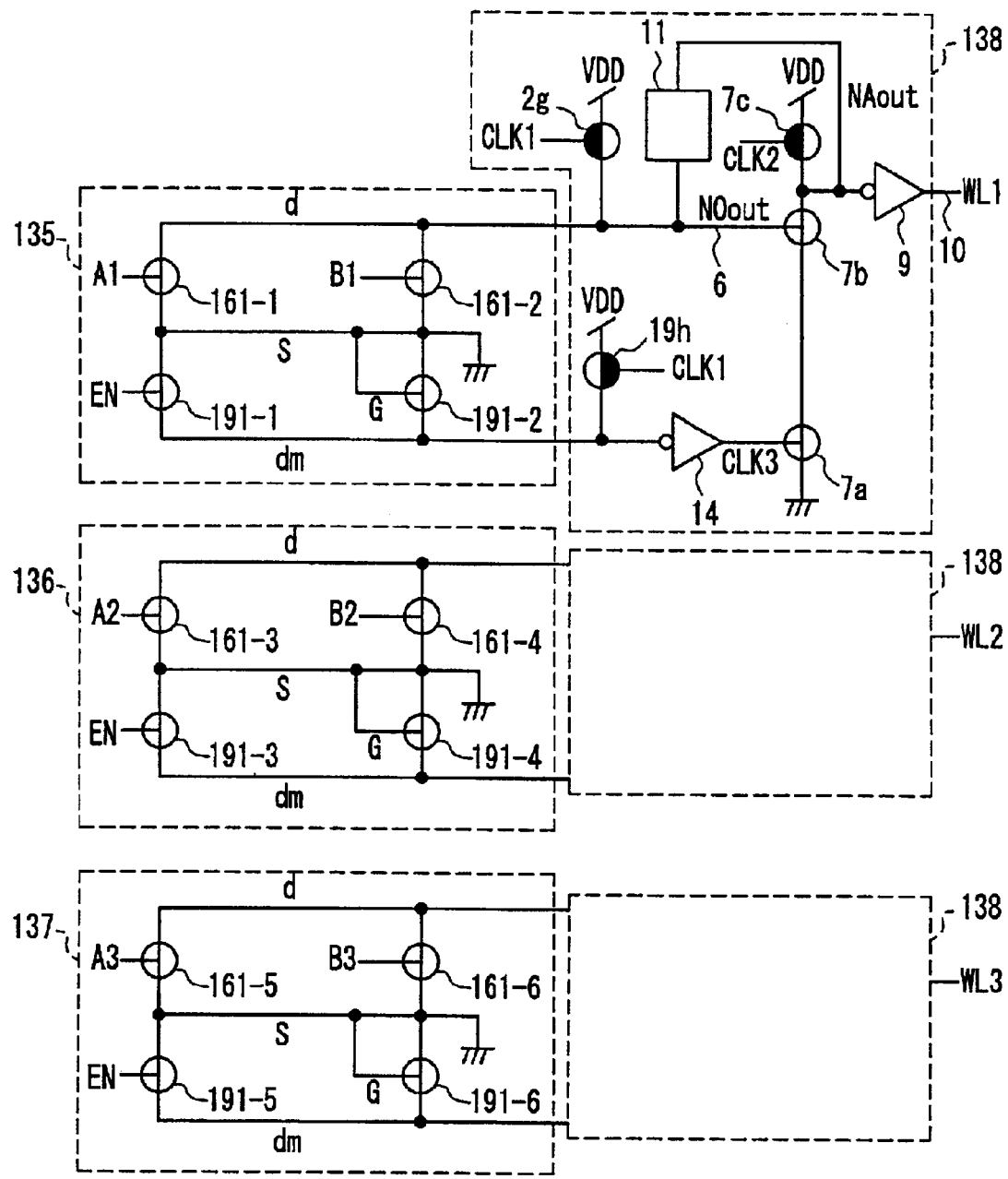
FIG. 13B is a circuit diagram showing an exemplary configuration of the semiconductor integrated circuit of Embodiment 5 according to the present invention.

FIG. 13A is a plan view showing a part of an exemplary circuit arrangement of a semiconductor integrated circuit of Embodiment 5 according to the present invention. FIG. 13B is a circuit diagram showing an exemplary configuration of a semiconductor integrated circuit of Embodiment 5 according to the present invention. In FIG. 13B, the components with the same configuration and function as those in FIG. 10 are denoted with the same reference numerals as those therein. Furthermore, reference numeral 138 denotes a circuit element other than the first and second NOR dynamic circuits.

In FIG. 13A, a plurality of circuit blocks 131, 132, 133, and 134 are formed on a semiconductor substrate at an equal interval (L0) in a direction lateral to other adjacent circuit blocks 111 and 112. As shown in FIG. 13B, the circuit block 131 (second circuit block) includes second N-type MOS transistors 191-1, 191-3, and 191-5 constituting a second NOR dynamic circuit, which receive an enable signal EN, respectively. The circuit block 132 (first circuit block) includes first N-type MOS transistors 161-1, 161-3, and 161-5 constituting a first NOR dynamic circuit, which receive data A1, A2, and A3, respectively, as shown in FIG. 13B. The circuit block 133 (second circuit block) includes third N-type MOS transistors 191-2, 191-4, and 191-6 constituting the second NOR dynamic circuit. The circuit block 134 (first circuit block) includes first N-type MOS transistors 161-2, 161-4, and 161-6 constituting the first NOR dynamic circuit, which receive data B1, B2, and B3, respectively, as shown in FIG. 13B.

In the circuit blocks 131 and 133, the dummy drain diffusion regions "dm", the source diffusion regions "s" and the dummy gate electrodes are formed in a direction longitudinal to the other circuit blocks 111 and 112. Furthermore, in the circuit blocks 132 and 134, the drain diffusion regions "d", the source diffusion regions "s" and the gate electrodes are formed in a direction longitudinal to the other circuit blocks 111 and 112. The source diffusion regions "a" and the dummy gate electrodes that do not receive an enable signal EN are connected in common to a ground potential G.

By connecting each circuit block in a lateral direction, as shown in FIG. 13B, the first and second NOR dynamic circuits 135, 136 and 137 are formed.

In FIG. 13A, a distance L1 between the circuit block 111 adjacent on the left side and the second circuit block 131 and a distance L2 between the circuit block 112 adjacent on the right side and the first circuit block 134 satisfy a relationship: L1<L2. The reason for this is as follows. In the case where transistor characteristics are degraded by STI formed in a region where the distance with respect to the other circuit block is short, by disposing the second circuit block to be provided as a dummy, degradation of transistor characteristics (decrease in current ability, increase in threshold voltage, and the like) in the first circuit block can be prevented.

In the present embodiment, based on the fact that transistor characteristics are degraded mostly by STI formed in a region where the distance with respect to the other circuit block is narrow, the case where the second circuit block is disposed in a region where the distance with respect to the other circuit block is narrow has been illustrated and described. However, considering the case where transistor characteristics may be improved by STI formed in a region where the distance with respect to the other circuit block is short, in this case, the first circuit block and the second circuit block may be exchanged.

Furthermore, in the same way as in Embodiment 4, by providing the source diffusion regions "s" on an outer side in a direction longitudinal to each circuit block, the influence of degeneration of diffusion regions is reduced, and lacing due to a signal delay between the drain "d" and the dummy drain "dm" can be reduced.

As described above, according to the present embodiment, degradation and non-uniformity of diffusion regions are eliminated, and lacing due to a signal delay between the drains "d" of a plurality of first N-type MOS transistors and dummy drains "d" of the second N-type MOS transistor and a plurality of the third N-type MOS transistors to be provided as dummies can be reduced.

Next, Embodiment 6 of the present invention will be described, in which the first NOR dynamic circuit and the second NOR dynamic circuit provided as a dummy in Embodiment 3 are arranged in a longitudinal direction as one circuit block 141, and two first NOR dynamic circuits adjacent in a longitudinal direction share one second NOR dynamic circuit.

Figure 14A:
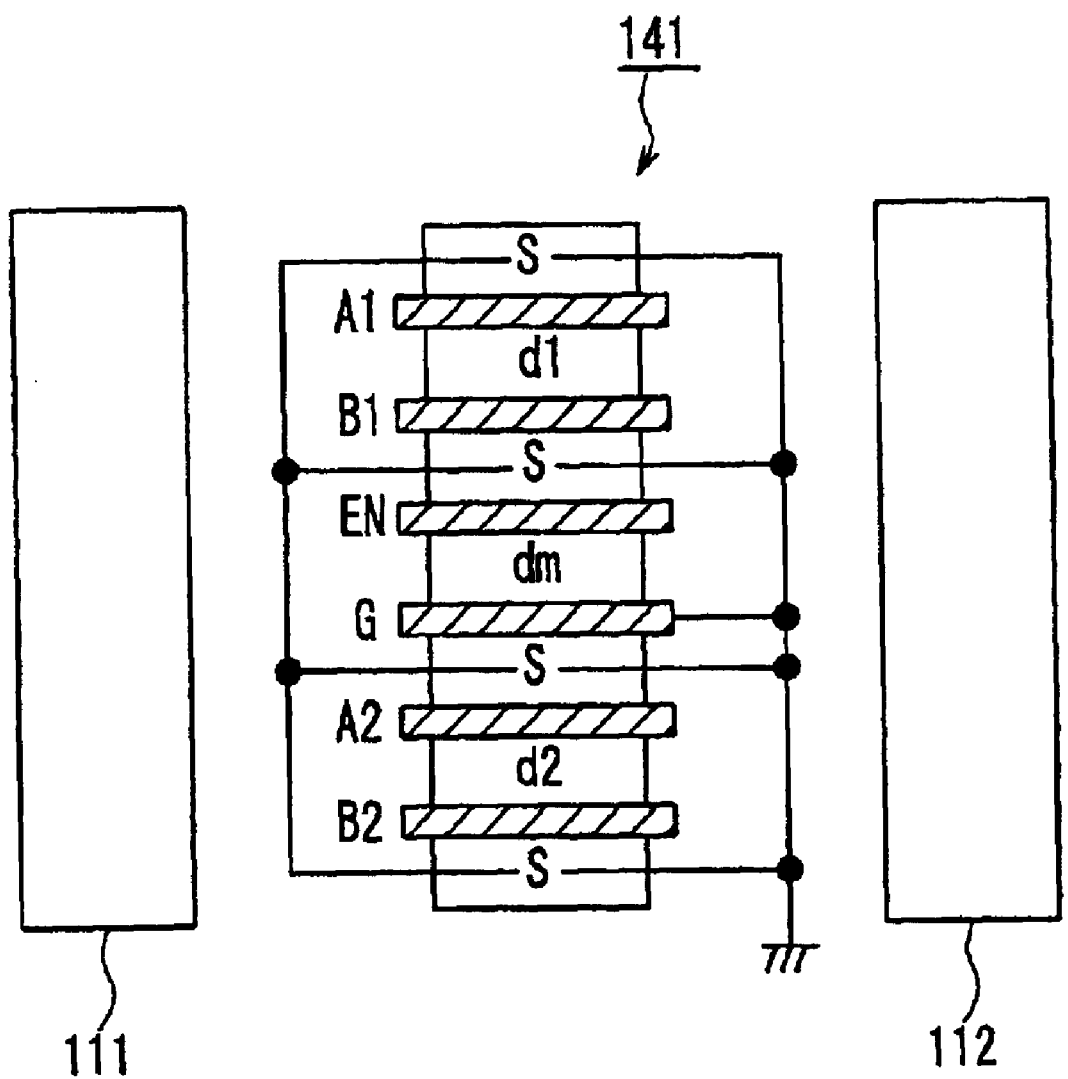
FIG. 14A is a plan view showing a part of an exemplary circuit arrangement of a semiconductor integrated circuit of Embodiment 6 according to the present invention.
Figure 14B:
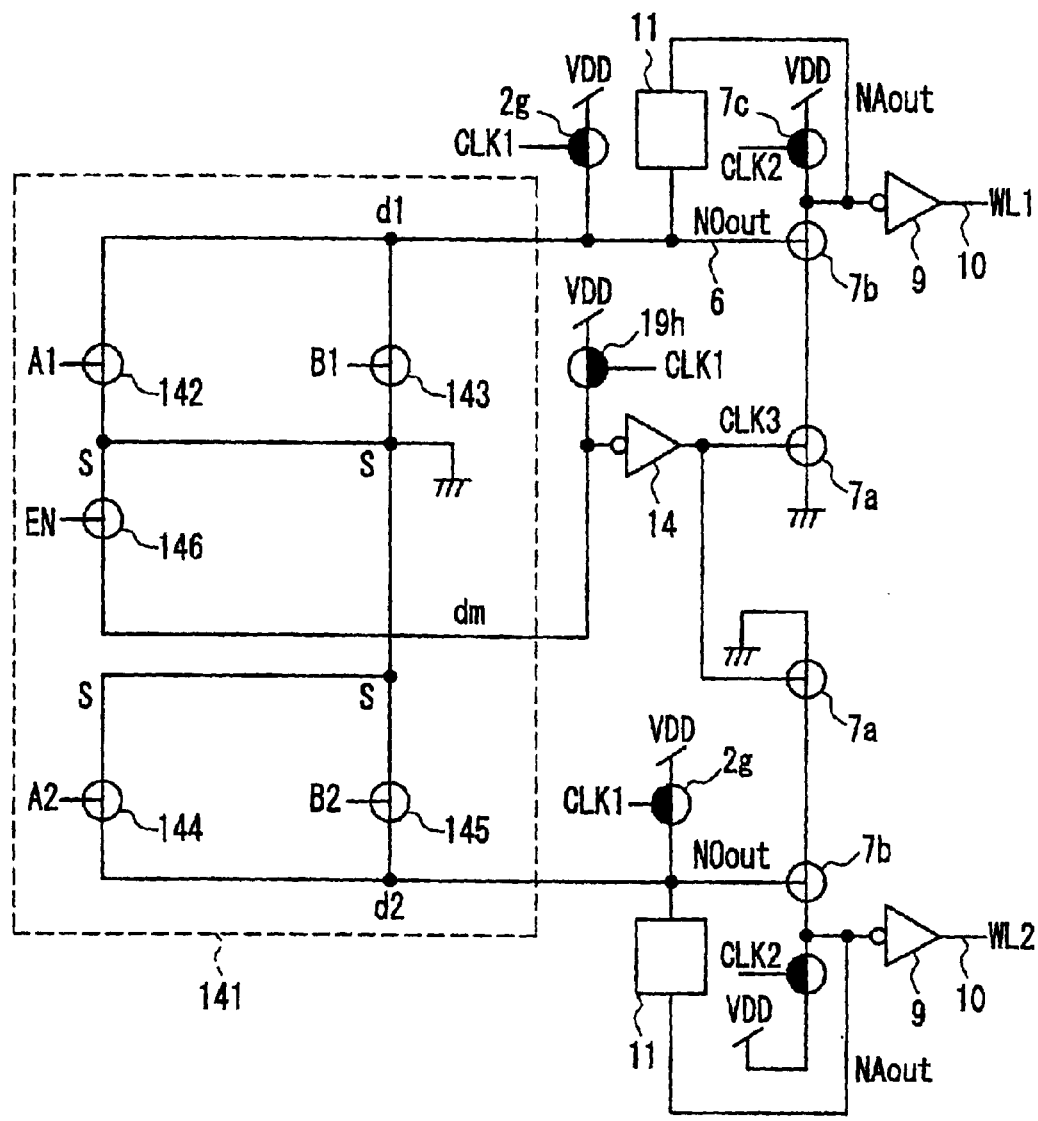
FIG. 14B is a circuit diagram showing an exemplary configuration of the semiconductor integrated circuit of Embodiment 6 according to the present invention.

FIG. 14A is a plan view showing a part of an exemplary circuit arrangement of a semiconductor integrated circuit of Embodiment 6 according to the present invention. FIG. 14B is a circuit diagram showing an exemplary configuration of the semiconductor integrated circuit of Embodiment 6 according to the present invention. In FIG. 14B, the components with the same configuration and function as those in FIG. 10 are denoted with the same reference numerals as those therein.

In FIG. 14A, a source diffusion region "s", a gate electrode that receives data A1, a drain diffusion region "d1", a gate electrode that receives data B1, a source diffusion region "s", a gate electrode that receives an enable signal "EN", a dummy drain diffusion region "dm", a dummy gate electrode, a source diffusion region "s", a gate electrode that receives data A2, a drain diffusion region "d2", a gate electrode that receives data B2, and a source diffusion region "s" are formed in this order in a direction longitudinal to other adjacent circuit blocks 111 and 112 to form a circuit block 141. The dummy gate electrode and the source diffusion regions "s" are connected in common to a ground potential G.

In FIG. 14B, one of two adjacent first NOR dynamic circuits is composed of an N-type MOS transistor 142 that receives the data A1 and an N-type MOS transistor 143 that receives the data B1. Furthermore, the other of two adjacent first NOR dynamic circuits is composed of an N-type MOS transistor 144 that receives the data A2 and an N-type MOS transistor 145 that receives the data B2. Furthermore, the second NOR dynamic circuit is composed of an N-type MOS transistor 146 that receives the enable signal EN.

As described above, in the present embodiment, two adjacent first NOR dynamic circuits that receive a plurality of data share one second NOR dynamic circuit provided as a dummy. This reduces a cell area and increases an area of diffusion regions, whereby degeneration can be reduced.

Figure 17:
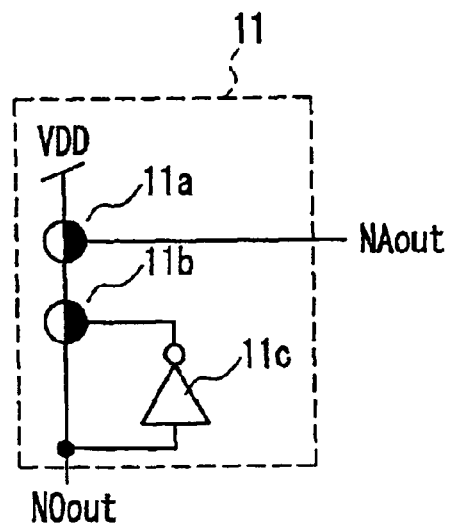
FIG. 17 is a circuit diagram showing a configuration of a compensating circuit in a semiconductor integrated circuit of another embodiment according to the present invention.

As another embodiment of the present invention, in a circuit where a NAND dynamic circuit 7 is activated with the clock CLK3 supplied from the dummy second NOR dynamic circuit 19 that functions as a delay circuit as shown in FIG. 10, the compensating circuit 11 in FIG. 10 is composed of the P-type MOS transistors 11a and 11b and the inverter 11c (second inverter) as shown in FIG. 17, whereby an operation speed is increased, glitches are suppressed, a stable operation can be realized at a lower voltage, and a lower power consumption is made possible.

Figure 18:
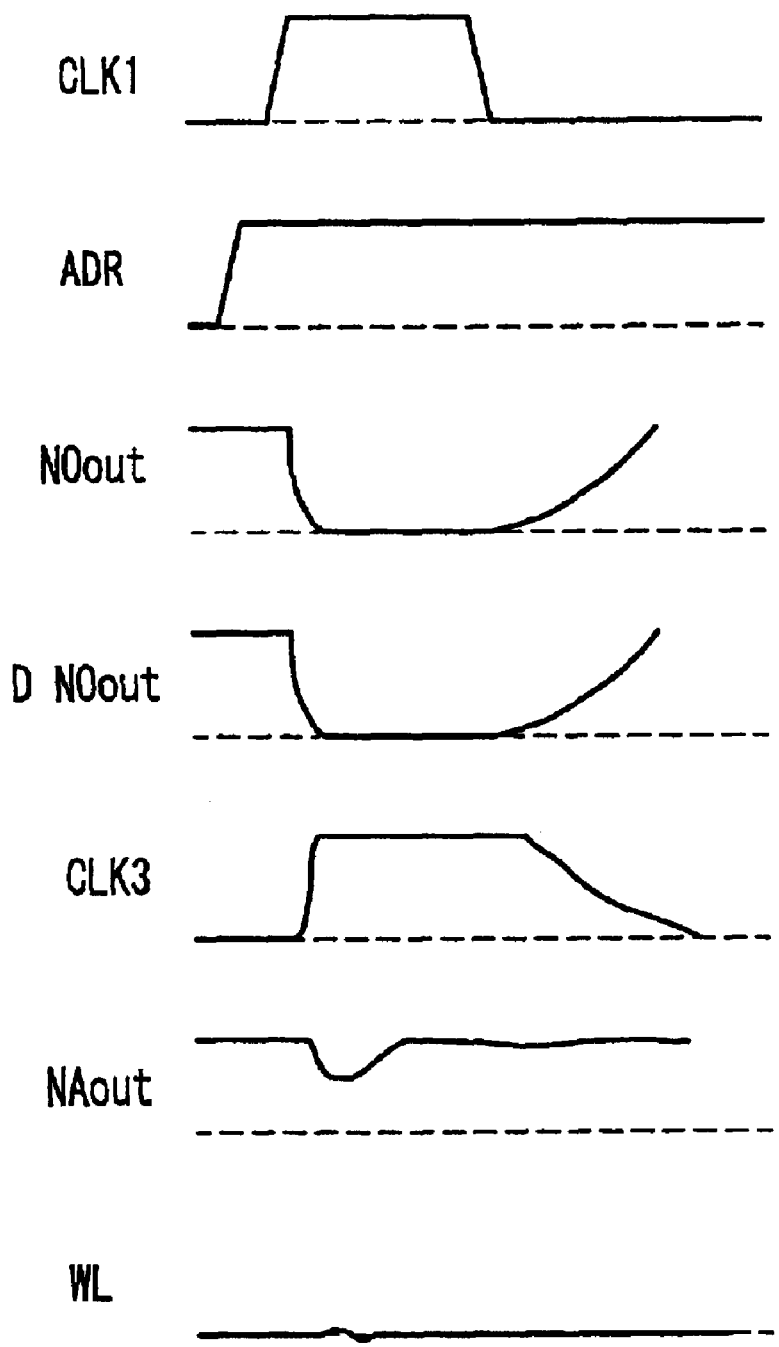
FIG. 18 is a timing chart of signals of respective portions in the case of using the compensating circuit in FIG. 17.

More specifically, when a voltage level of the signal NOout of the output node 6 of the first NOR dynamic circuit 16 is lower than a switching voltage of the inverter 11c, an output signal of the inverter 11c becomes a logic "H" level, and the P-type MOS transistor 11b is cut off. Consequently, as shown in FIG. 18, a through rate of the output signal NOout of the first NOR dynamic circuit 16 and that of the output signal DNOout of the second NOR dynamic circuit 19 become steep.

Thus, a leakage current (through current) of the output signal NAout of the NAND dynamic circuit 7 is reduced, and a voltage level of the output signal NAout is held at a high voltage, whereby the output signal WL of the inverter 9 (first inverter) in the subsequent stage becomes likely to be held at a logic "L" level. Thus, by appropriately combining the dummy delay circuit with the circuit compensating for a coupling capacitance, glitches can be further effectively suppressed in the signal WL of the word line 10.

As described above, according to the present invention, a semiconductor integrated circuit can be realized, in which an operation speed is increased, an operation is stabilized, lower power consumption is realized, transistor characteristics are not degraded due to a miniaturization process, in a system where a NOR dynamic circuit is connected to a NAND dynamic circuit.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and al changes which come within the meaning and range of equivalency of the claims are intended to be embraced therein.

What is claimed is:

1. A semiconductor integrated circuit, comprising:
   a NOR dynamic circuit for receiving clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched;
   a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held; and
   a compensating circuit for compensating for a voltage drop of the first output node, which is caused by a coupling capacitance formed between the first output node and the second output node, which occurs when the second output node is discharged while the charge of the first output node is held,
   wherein the compensating circuit includes a feedback circuit for charging the first output node in a case where the second output node is discharged, and
   the compensating circuit comprises:
      an inverter in which an input terminal is connected to a second output node of the NAND dynamic circuit; and
      a MOS transistor in which a gate is connected to an output terminal of the inverter, and a source and a drain are connected in common to the first output node of the NOR dynamic circuit.

2. A semiconductor integrated circuit, comprising:
   a NOR dynamic circuit for receiving clock and a plurality of first data, holding a charge of a first output node in a case where during one of a period from rising to falling of the clock and a period from falling to rising of the clock, the first output node is charged, and during the other period, all the plurality of fist data are matched with each other, and discharging the first output node in a case where at least one of the plurality of first data is not matched;
   a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held; and
   a compensating circuit for compensating for a voltage drop of the first output node, which is caused by a coupling capacitance formed between the first output node and the second output node, which occurs when the second output node is discharged while the charge of the first output node is held,
   wherein the compensating circuit includes a feedback circuit for charging the first output node in a case where the second output node is discharged, and
   the NOR dynamic circuit comprises:
      a first P-type MOS transistor in which a gate is supplied with the first clock and a source is connected to a power source;
      a switching circuit for receiving a ground potential and the plurality of first data, selectively outputting the ground potential while the first output node of the NOR dynamic circuit is charged, and thereafter, selectively outputting the plurality of data; and
      a plurality of N-type MOS transistors in which gates are supplied with an output signal of the switching circuit, sources are grounded and drains are connected to a drain of the first P-type MOS transistor, whereby the first output node is formed.

3. A semiconductor integrated circuit, comprising:
   a NOR dynamic circuit for receiving clock and a plurality of first data, holding a charge of a first output node in a case where during one of a Period from rising to falling of the clock and a period from falling to rising of the clock, the first output node is charged, and during the other period, all the plurality of first data are matched with each other, and discharging the first output node in a case where at least one of the plurality of first data is not matched;
   a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held;
   a compensating circuit for compensating for a voltage drop of the first output node, which is caused by a coupling capacitance formed between the first output node and the second output node, which occurs when the second output node is discharged while the charge of the first output node is held; and
   a matching detection circuit, wherein the compensating circuit includes a feedback circuit for charging the first output node in a case where the second output node is discharged, and the matching detection circuit receives one of a plurality of second data and one of a plurality of third data, detects whether or not the data are matched with each other, and outputs a detection result as the plurality of first data.

4. A semiconductor integrated circuit, comprising:

a NOR dynamic circuit for receiving a clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched; and a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held, wherein the rising time of the clock is longer than a discharge time of the first output node of the NOR dynamic circuit.

5. A semiconductor integrated circuit according to claim 4, wherein the compensating circuit comprises a P-type MOS transistor in which a gate is connected to a second output node of the NAND dynamic circuit, a source is connected to a power source and a drain is connected to a first output node of the NOR dynamic circuit.

6. A semiconductor integrated circuit according to claim 4, wherein the NOR dynamic circuit comprises:

a first P-type MOS transistor in which a gate is supplied with the first clock and a source is connected to a power source;

a switching circuit for receiving a ground potential and the plurality of first data, selectively outputting the ground potential while the first output node of the NOR dynamic circuit is charged, and thereafter, selectively outputting the plurality of data; and a plurality of N-type MOS transistors in which gates are supplied with an output signal of the switching circuit, sources are grounded and drains are connected to a drain of the first P-type MOS transistor, whereby the first output node is formed.

7. A semiconductor integrated circuit according to claim 4, comprising a matching detection circuit, wherein the matching detection circuit receives one of a plurality of second data and one of a plurality of third data, detects whether or not the data are matched with each other, and outputs a detection result as the plurality of first data.

8. A semiconductor integrated circuit according to claim 4, wherein the second clock is composed of a clock for charging the second output node of the NAND dynamic circuit and a clock for discharging the second output node, the clock for charging is the same as the first clock, and a rising time of the clock for discharging is longer than a discharge time of the first output node of the NOR dynamic circuit.

9. A semiconductor integrated circuit according to claim 4, wherein the NAND dynamic circuit comprises a first NAND dynamic circuit and a second NAND dynamic circuit, wherein the first NAND dynamic circuit charges the second output node during one of a period from rising to falling of the clock and a period from falling to rising of the clock, wherein the second NAND dynamic circuit charges a third output node during one of a period from rising to falling of the clock and a period from falling to rising of the clock, and holds the charge of the second output node during a half period of the clock, and wherein the semiconductor integrated circuit further comprises a position feedback circuit for receiving a signal from the third output node and holding a charge of the third output node.

10. A semiconductor integrated circuit according to claim 4, comprising a positive feedback circuit in which inverters are connected in a cascade, and an output terminal of the inverter in a final stage is connected to an input terminal of the inverter in a first stage and the second output node of the NAND dynamic circuit, wherein the positive feedback circuit holds the charge of the second output node during one period of the second clock.

11. A semiconductor integrated circuit according to claim 4, wherein the first clock and the second clock have different duty ratios, and voltage levels of the first clock and the second clock are lower than operation voltages of the NOR dynamic circuit and the NAND dynamic circuit.

12. A semiconductor integrated circuit according to claim 4, comprising a second NOR dynamic circuit, and an inverter in which an input terminal is connected to a third output node of the second NOR dynamic circuit, and the second clock is supplied from an output terminal, wherein the second NOR dynamic circuit comprises:

a second P-type MOS transistor in which a gate is supplied with the first clock and a source is connected to a power source;

a switching circuit for receiving a power source potential and a ground potential, selectively outputting the ground potential while the first output node of the NOR dynamic circuit is charged, and thereafter, selectively outputting the power source potential;

a third P-type MOS transistor in which a gate is supplied with an output signal of the switching circuit, a source is grounded and a drain is connected to a drain of the second P-type MOS transistor; and a plurality of fourth N-type MOS transistors in which a gate and a source are grounded and a drain is connected to a drain of the second P-type MOS transistor.

13. A semiconductor integrated circuit according to claim 4, comprising a second NOR dynamic circuit, and an inverter in which an input terminal is connected to a third output node of the second NOR dynamic circuit, and the clock is supplied from an output terminal, wherein the second NOR dynamic circuit comprises:

a third N-type MOS transistor in which a gate is supplied with the first clock and a source is grounded;

a second P-type MOS transistor in which a gate is supplied with the first clock and a source is connected to a power source; and a plurality of fourth N-type MOS transistors in which one gate is connected to an enable signal, the remaining gates are grounded, sources are connected to a drain of the third N-type transistor and drains are connected to a drain of the second P-type MOS transistor, whereby the third output node is formed.

14. A semiconductor integrated circuit according to claim 13, wherein, among the plurality of fourth N-type MOS transistors, an N-type MOS transistor in which a gate is connected to a power source is positioned farthest from the input terminal of the inverter in physical arrangement.

15. A semiconductor integrated circuit according to claim 13, wherein the clock is subjected to control for beginning and suspension of supply.

16. A semiconductor integrated circuit, comprising:
   a NOR dynamic circuit for receiving clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched;
   a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held; and
   a compensating circuit for compensating for a voltage drop of the first output node, which is caused by a coupling capacitance formed between the first output node and the second output node, which occurs when the second output node is discharged while the charge of the first output node is held,
   wherein the compensating circuit includes a feedback circuit for charging the first output node in a case where the second output node is discharged, and
   the compensating circuit comprises:
      an inverter in which an input terminal is connected to a second output node of the NAND dynamic circuit; and
      an N-type MOS transistor in which a gate is connected to an output terminal of the inverter and a source and a drain are connected in common to the first output node of the NOR dynamic circuit.

17. A semiconductor integrated circuit, comprising:
   a NOR dynamic circuit for receiving clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched;
   a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held;
   a compensating circuit for compensating for a voltage drop of the first output node, which is caused by a coupling capacitance formed between the first output node and the second output node, which occurs when the second output node is discharged while the charge of the first output node is held; and
   a positive feedback circuit in which inverters are connected in a cascade, and an output terminal of the inverter in a final stage is connected to an input terminal of the inverter in a first stage and the second output node of the NAND dynamic circuit,
   wherein the compensating circuit includes a feedback circuit for charging the first output node in a case where the second output node is discharged, and
   the positive feedback circuit holds the charge of the second output node during one period of the second clock.

18. A semiconductor integrated circuit, comprising:
   a NOR dynamic circuit for receiving clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched;
   a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held; and
   a compensating circuit for compensating for a voltage drop of the first output node, which is caused by a coupling capacitance formed between the first output node and the second output node, which occurs when the second output node is discharged while the charge of the first output node is held,
   wherein the compensating circuit includes a feedback circuit for charging the first output node in a case where the second output node is discharged, and
   the first clock and the second clock have different duty ratios, and voltage levels of the first clock and the second clock are lower than operation voltages of the NOR dynamic circuit and the NAND dynamic circuit.

19. A semiconductor integrated circuit, comprising:
   a NOR dynamic circuit for receiving clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched;
   a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held;
   a compensating circuit for compensating for a voltage drop of the first output node, which is caused by a coupling capacitance formed between the first output node and the second output node, which occurs when the second output node is discharged while the charge of the first output node is held;

a second NOR dynamic circuit; and an inverter in which an input terminal is connected to a third output node of the second NOR dynamic circuit and the second clock is supplied from an output terminal, wherein the compensating circuit includes a feedback circuit for charging the first output node in a case where the second output node is discharged, and wherein the second NOR dynamic circuit comprises:
 a second P-type MOS transistor in which a gate is supplied with the first clock and a source is connected to a power source;
 a switching circuit for receiving a power source potential and a ground potential, selectively outputting the ground potential while the first output node of the NOR dynamic circuit is charged, and thereafter, selectively outputting the power source potential;
 a third P-type MOS transistor in which a gate is supplied with an output signal of the switching circuit, a source is grounded and a drain is connected to a drain of the second P-type MOS transistor; and
 a plurality of fourth N-type MOS transistors in which a gate and a source are grounded and a drain is connected to a drain of the second P-type MOS transistor.

20. A semiconductor integrated circuit, comprising:
 a first NOR dynamic circuit comprising: a first P-type MOS transistor in which a gate is supplied with a first clock and a source is connected to a power source; a first switching circuit for receiving a ground potential and a plurality of first data, selectively outputting the ground potential while the first output node is charged, and thereafter, selectively outputting the plurality of data; and a plurality of first N-type MOS transistors in which gates are supplied with an output signal of the first switching circuit, sources are grounded and drains are connected to a drain of the first P-type MOS transistor, whereby the first output node is formed, in order to receive the first clock and the plurality of first data, to hold the charge of the first output node in a case where during one of a period from rising to falling of the first clock and a period from falling to rising of the first clock, the first output node is charged, and during the other period, all the plurality of first data are matched with each other, and to discharge the first output node in a case where at least one of the plurality of first data is not matched;

a NAND dynamic circuit for receiving a second clock and a signal from the first output node, holding a charge of a second output node in a case where during one of a period from rising to falling of the second clock and a period from falling to rising of the second clock, the first output node is discharged and discharging the second output node in a case where the charge of the first output node is held;

a second NOR dynamic circuit comprising: a second P-type MOS transistor in which a gate is supplied with the first clock and a source is connected to a power source; a second switching circuit for receiving a power source potential and a ground potential, selectively outputting the ground potential while the first output node of the first NOR dynamic circuit is charged, and thereafter, selectively outputting the power source potential; a second N-type MOS transistor in which a gate is supplied with an output signal from the second switching circuit, a source is grounded and a drain is connected to a drain of the second P-type MOS transistor; and a plurality of third N-type MOS transistors in which a gate and a source are grounded and a drain is connected to a drain of the second P-type MOS transistor; and an inverter in which an input terminal is connected to the third output node of the second NOR dynamic circuit and the second clock is supplied from an output terminal, wherein the plurality of first N-type MOS transistors constituting the first NOR dynamic circuit, and the second N-type MOS transistor and the plurality of third N-type MOS transistors constituting the second NOR dynamic circuit are formed as one circuit block on a semiconductor substrate, and the plurality of first N-type MOS transistors, and the second N-type MOS transistor and the plurality of third N-type MOS transistors are formed in a direction lateral to other adjacent circuit blocks so that diffusion regions constituting sources and drains thereof, and gate electrodes thereof are formed successively, and in the one circuit block, diffusion regions constituting drains of the plurality of first N-type MOS transistors or drains of the second N-type MOS transistor and the plurality of third N-type MOS transistors are formed on an outer side.

21. A semiconductor integrated circuit according to claim 20, wherein in a case where characteristics of diffusion regions are degraded due to a shallow trench insulator formed between the diffusion regions and the other adjacent circuit blocks, the diffusion regions constituting the drains of the second Ntype MOS transistor and the plurality of third N-type MOS transistors are formed on an outer side.

22. A semiconductor integrated circuit according to claim 20, wherein in a case where characteristics of diffusion regions are improved due to a shallow trench insulator formed between the diffusion regions and the other adjacent circuit blocks, the diffusion regions constituting the drains of the plurality of first N-type MOS transistors are formed on an outer side.

23. A semiconductor integrated circuit according to claim 20, wherein diffusion regions constituting sources further are formed on an outer side of the diffusion regions constituting the drains of the plurality of first N-type MOS transistors, or the drains of the second N-type MOS transistor and the plurality of third N-type MOS transistors.

24. A semiconductor integrated circuit, comprising:
 a plurality of first NOR dynamic circuits each comprising: a first P-type MOS transistor in which a gate is supplied with a first clock and a source is connected to a power source; a first switching circuit for receiving a ground potential and a plurality of first data, selectively outputting the ground potential while the first output node is charged, and thereafter, selectively outputting the plurality of data; and a plurality of first N-type MOS transistors in which gates are supplied with an output signal of the first switching circuit, sources are grounded and drains are connected to a drain of the first P-type MOS transistor, whereby the first output node is formed, in order to receive the first clock and the plurality of first data, to hold the charge of the first output node in a case where during one of a period from rising to falling of the first clock and a period from falling to rising of the first clock, the first output node is charged, and during the other period, all the plurality of first data are matched with each other, and to discharge the first output node in a case where at least one of the plurality of first data is not matched;

a plurality of NAND dynamic circuits for receiving a second clock and a signal from the first output node, holding a charge of a second output node in a case where during one of a period from rising to falling of the second clock and a period from falling to rising of the second clock, the first output node is discharged, and discharging the second output node in a case where the charge of the first output node is held, a plurality of second NOR dynamic circuits each comprising: a second P-type MOS transistor in which a gate is supplied with the first clock and a source is connected to a power source; a second switching circuit for receiving a power source potential and a ground potential, selectively outputting the ground potential while the first output node of the first NOR dynamic circuit is charged, and thereafter, selectively outputting the power source potential; a second N-type MOS transistor in which a gate is supplied with an output signal from the second switching circuit, a source is grounded and a drain is connected to a drain of the second P-type MOS transistor; and a plurality of third N-type MOS transistors in which a gate and a source are grounded and a drain is connected to a drain of the second P-type MOS transistor; and an inverter in which an input terminal is connected to the third output node of the second NOR dynamic circuit, and the second clock is supplied from an output terminal, wherein a first circuit block in which the plurality of first N-type MOS transistors constituting the first NOR dynamic circuit are provided, and a second circuit block in which the second N-type MOS transistor and the plurality of third N-type MOS transistors constituting the second NOR dynamic circuit are provided, are formed on a semiconductor substrate so that diffusion regions constituting sources and drains thereof and gate electrodes thereof are formed successively in a direction longitudinal to other adjacent circuit blocks, and the first circuit block and the second circuit block are formed in a lateral direction at an equal interval, and arrangement of the first circuit block and the second circuit block is varied depending upon a distance with respect to the other adjacent circuit blocks.

25. A semiconductor integrated circuit according to claim 24, wherein in a case where characteristics of the diffusion regions in the first or second circuit block are degraded due to a shallow trench insulator formed between the diffusion regions and the other adjacent circuit blocks, the second circuit block is disposed on a side at a shorter distance from the other adjacent circuit block.

26. A semiconductor integrated circuit according to claim 24, wherein in a case where characteristics of the diffusion regions in the first or second circuit block are improved due to a shallow trench insulator formed between the diffusion regions and the other adjacent circuit blocks, the second circuit block is disposed on a side at a longer distance from the other adjacent circuit block.

27. A semiconductor integrated circuit according to claim 24, wherein diffusion regions constituting sources further are formed on an outer side of the diffusion regions constituting the drains on an outer side in a longitudinal direction of the first and second circuit blocks.

28. A semiconductor integrated circuit, comprising:

a plurality of first NOR dynamic circuits each comprising: a first P-type MOS transistor in which a gate is supplied with a first clock and a source is connected to a power source; a first switching circuit for receiving a ground potential and a plurality of first data, selectively outputting the ground potential while the first output node is charged, and thereafter, selectively outputting the plurality of data; and a plurality of first N-type MOS transistors in which gates are supplied with an output signal of the first switching circuit, sources are grounded and drains are connected to a drain of the first P-type MOS transistor, whereby the first output node is formed, in order to receive the first clock and the plurality of first data, to hold the charge of the first output node in a case where during one of a period from rising to falling of the first clock and a period from falling to rising of the first clock, the first output node is charged, and during the other period, all the plurality of first data are matched with each other, and to discharge the first output node in a case where at least one of the plurality of first data is not matched;

a plurality of NAND dynamic circuits for receiving a second clock and a signal from the first output node, holding a charge of a second output node in a case where during one of a period from rising to falling of the second clock and a period from falling to rising of the second clock, the first output node is discharged, and discharging the second output node in a case where the charge of the first output node is held, a plurality of second NOR dynamic circuits each comprising: a second P-type MOS transistor in which a gate is supplied with the first clock and a source is connected to a power source; a second switching circuit for receiving a power source potential and a ground potential, selectively outputting the ground potential while the first output node of the first NOR dynamic circuit is charged, and thereafter, selectively outputting the power source potential, a second N-type MOS transistor in which a gate is supplied with an output signal from the second switching circuit, a source is grounded and a drain is connected to a drain of the second P-type MOS transistor; and a plurality of third N-type MOS transistors in which a gate and a source are grounded and a drain is connected to a drain of the second P-type MOS transistor; and an inverter in which an input terminal is connected to the third output node of the second NOR dynamic circuit, and the second clock is supplied from an output terminal, wherein among the plurality of first NOR dynamic circuits, the plurality of first N-type MOS transistors constituting each of two first NOR dynamic circuits adjacent in a direction longitudinal to other adjacent circuit blocks, are formed on a semiconductor substrate as one circuit block so as to function as the second N-type MOS transistor and the plurality of third N-type MOS transistors constituting one of the plurality of second NOR dynamic circuits, and the plurality of first N-type MOS transistors, and the second Ntype MOS transistor and the plurality of third N-type MOS transistors are formed so that diffusion regions constituting sources and drains thereof and gate electrodes thereof are formed successively in a direction longitudinal to other adjacent circuit blocks.

29. A semiconductor integrated circuit, comprising: a first NOR dynamic circuit comprising: a first P-type MOS transistor in which a gate is supplied with a first clock and a source is connected to a power source; a first switching circuit for receiving a ground potential and a plurality of first data, selectively outputting the ground potential while the first output node is charged, and thereafter, selectively outputting the plurality of data; and a plurality of first N-type MOS transistors in which gates are supplied with an output signal of the first switching circuit, sources are grounded and drains are connected to a drain of the first P-type MOS transistor, whereby the first output node is formed, in order to receive the first clock and the plurality of first data, to hold the charge of the first output node in a case where during one of a period from rising to falling of the first clock and a period from falling to rising of the first clock, the first output node is charged, and during the other period, all the plurality of first data are matched with each other, and to discharge the first output node in a case where at least one of the plurality of first data is not matched;

a NAND dynamic circuit for receiving a second clock and a signal from the first output node, holding a charge of a second output node in a case where during one of a period from rising to falling of the second clock and a period from falling to rising of the second clock, the first output node is discharged, and discharging the second output node in a case where the charge of the first output node is held, a second NOR dynamic circuit comprising: a second P-type MOS transistor in which a gate is supplied with the first clock and a source is connected to a power source; a second switching circuit for receiving a power source potential and a ground potential, selectively outputting the ground potential while the first output node of the first NOR dynamic circuit is charged, and thereafter, selectively outputting the power source potential; a second N-type MOS transistor in which a gate is supplied with an output signal from the second switching circuit, a source is grounded and a drain is connected to a drain of the second P-type MOS transistor; and a plurality of third N-type MOS transistors in which a gate and a source are grounded and a drain is connected to a drain of the second P-type MOS transistor;

a first inverter in which an input terminal is connected to the third output node of the second NOR dynamic circuit, and the second clock is supplied from an output terminal; and a compensating circuit for compensating for a voltage drop of the first output node, which is caused by a coupling capacitance formed between the first output node and the second output node, occurring when the second output node is discharged while the charge of the first output node is held, wherein the compensating circuit comprises:
        a third P-type MOS transistor in which a gate is connected to the second output node and a source is connected to a power source;
        a fourth P-type MOS transistor in which a source is connected to a drain of the third P-type MOS transistor and a drain is connected to the first output node; and a second inverter in which an input terminal is connected to a drain of the fourth P-type MOS transistor and an output terminal is connected to a gate of the fourth P-type MOS transistor.

30. A semiconductor integrated circuit, comprising:
    a NOR dynamic circuit for receiving a clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched, wherein the NOR dynamic circuit comprises:
        a first N-type MOS transistor in which a gate is supplied with the first clock, and a source is grounded;
        a first P-type MOS transistor in which a gate is supplied with the first clock and a source is connected to a power source; and
        a plurality of second N-type MOS transistors in which gates are supplied with the plurality of first data, sources are connected to a drain of the first-N-type MOS transistor and drains are connected to a drain of the first P-type MOS transistor, whereby the first output node is formed;

a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held; and a compensating circuit for compensating for a voltage drop of the first output node, which is caused by a coupling capacitance formed between the first output node and the second output node, which occurs when the second output node is discharged while the charge of the first output node is held, wherein the compensating circuit comprises:
        an inverter in which an input terminal is connected to a second output node of the NAND dynamic circuit; and
        an N-type MOS transistor in which a gate is connected to an output terminal of the inverter, and a source and a drain are connected in common to the first output node of the NOR dynamic circuit.

31. A semiconductor integrated circuit, comprising:
    a NOR dynamic circuit for receiving a clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched, wherein the NOR dynamic circuit comprises:
        a first N-type MOS transistor in which a gate is supplied with the first clock, and a source is grounded;
        a first P-type MOS transistor in which a gate is supplied with the first clock and a source is connected to a power source; and
        a plurality of second N-type MOS transistors in which gates are supplied with the plurality of first data, sources are connected to a drain of the first-N-type MOS transistor and drains are connected to a drain of the first P-type MOS transistor, whereby the first output node is formed;

a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held; and a compensating circuit for compensating for a voltage drop of the first output node, which is caused by a coupling capacitance formed between the first output node and the second output node, which occurs when the second output node is discharged while the charge of the first output node is held, wherein the compensating circuit comprises:
an inverter in which an input terminal is connected to a second output node of the NAND dynamic circuit; and
a MOS transistor in which a gate is connected to an output terminal of the inverter, and a source and a drain are connected in common to the first output node of the NOR dynamic circuit.

32. A semiconductor integrated circuit, comprising:
a NOR dynamic circuit for receiving a clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched, wherein the NOR dynamic circuit comprises:
a first N-type MOS transistor in which a gate is supplied with the first clock, and a source is grounded;
a first P-type MOS transistor in which a gate is supplied with the first clock and a source is connected to a power source; and
a plurality of second N-type MOS transistors in which gates are supplied with the plurality of first data, sources are connected to a drain of the first-N-type MOS transistor and drains are connected to a drain of the first P-type MOS transistor, whereby the first output node is formed;
a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held; and
a compensating circuit for compensating for a voltage drop of the first output node, which is caused by a coupling capacitance formed between the first output node and the second output node, which occurs when the second output node is discharged while the charge of the first output node is held, wherein the NOR dynamic circuit comprises:
a first P-type MOS transistor in which a gate is supplied with the first clock and a source is connected to a power source;
a switching circuit for receiving a ground potential and the plurality of first data, selectively outputting the ground potential while the first output node of the NOR dynamic circuit is charged, and thereafter, selectively outputting the plurality of data; and
a plurality of N-type MOS transistors in which gates are supplied with an output signal of the switching circuit, sources are grounded and drains are connected to a drain of the first P-type MOS transistor, whereby the first output node is formed.

33. A semiconductor integrated circuit, comprising:
a NOR dynamic circuit for receiving a clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched, wherein the NOR dynamic circuit comprises:
a first N-type MOS transistor in which a gate is supplied with the first clock, and a source is grounded;
a first P-type MOS transistor in which a gate is supplied with the first clock and a source is connected to a power source; and
a plurality of second N-type MOS transistors in which gates are supplied with the plurality of first data, sources are connected to a drain of the first-N-type MOS transistor and drains are connected to a drain of the first P-type MOS transistor, whereby the first output node is formed;
a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held;
a compensating circuit for compensating for a voltage drop of the first output node, which is caused by a coupling capacitance formed between the first output node and the second output node, which occurs when the second output node is discharged while the charge of the first output node is held; and
a matching detection circuit, wherein the matching detection circuit receives one of a plurality of second data and one of a plurality of third data, detects whether or not the data are matched with each other, and outputs a detection result as the plurality of first data.

34. A semiconductor integrated circuit, comprising:
a NOR dynamic circuit for receiving a clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched, wherein the NOR dynamic circuit comprises:
a first N-type MOS transistor in which a gate is supplied with the first clock, and a source is grounded;
a first P-type MOS transistor in which a gate is supplied with the first clock and a source is connected to a power source; and
a plurality of second N-type MOS transistors in which gates are supplied with the plurality of first data, sources are connected to a drain of the first-N-type MOS transistor and drains are connected to a drain of the first P-type MOS transistor, whereby the first output node is formed;
a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held;

a compensating circuit for compensating for a voltage drop of the first output node, which is caused by a coupling capacitance formed between the first output node and the second output node, which occurs when the second output node is discharged while the charge of the first output node is held; and a positive feedback circuit in which inverters are connected in a cascade, and an output terminal of the inverter in a final stage is connected to an input terminal of the inverter in a first stage and the second output node of the NAND dynamic circuit, wherein the positive feedback circuit holds the charge of the second output node during one period of the second clock.

35. A semiconductor integrated circuit, comprising:

a NOR dynamic circuit for receiving a clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched, wherein the NOR dynamic circuit comprises:
  a first N-type MOS transistor in which a gate is supplied with the first clock, and a source is grounded;
  a first P-type MOS transistor in which a gate is supplied with the first clock and a source is connected to a power source; and
  a plurality of second N-type MOS transistors in which gates are supplied with the plurality of first data, sources are connected to a drain of the first-N-type MOS transistor and drains are connected to a drain of the first P-type MOS transistor, whereby the first output node is formed;

a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held; and a compensating circuit for compensating for a voltage drop of the first output node, which is caused by a coupling capacitance formed between the first output node and the second output node, which occurs when the second output node is discharged while the charge of the first output node is held, wherein the first clock and the second clock have different duty ratios, and voltage levels of the first clock and the second clock are lower than operation voltages of the NOR dynamic circuit and the NAND dynamic circuit.

36. A semiconductor integrated circuit, comprising:

a NOR dynamic circuit for receiving a clock and a plurality of first data, holding a charge of a first output node in a case where during one of a period from rising to falling of the clock and a period from falling to rising of the clock, the first output node is charged, and during the other period, all the plurality of first data are matched with each other, and discharging the first output node in a case where at least one of the plurality of first data is not matched, wherein the NOR dynamic circuit comprises:
  a first N-type MOS transistor in which a gate is supplied with the first clock, and a source is grounded;
  a first P-type MOS transistor in which a gate is supplied with the first clock and a source is connected to a power source; and
  a plurality of second N-type MOS transistors in which gates are supplied with the plurality of first data, sources are connected to a drain of the first-N-type MOS transistor and drains are connected to a drain of the first P-type MOS transistor, whereby the first output node is formed;

a NAND dynamic circuit for receiving the clock and a signal from the first output node, holding a charge of a second output node in a case where during one of a period from rising to falling of the clock and a period from falling to rising of the clock, the first output node is discharged, and discharging the second output node in a case where the charge of the first output node is held;

a compensating circuit for compensating for a voltage drop of the first output node, which is caused by a coupling capacitance formed between the first output node and the second output node, which occurs when the second output node is discharged while the charge of the first output node is held;

a second NOR dynamic circuit; and an inverter in which an input terminal is connected to a third output node of the second NOR dynamic circuit and the second clock is supplied from an output terminal, wherein the second NOR dynamic circuit comprises:
  a second P-type MOS transistor in which a gate is supplied with the first clock and a source is connected to a power source;
  a switching circuit for receiving a power source potential and a ground potential, selectively outputting the ground potential while the first output node of the NOR dynamic circuit is charged, and thereafter, selectively outputting the power source potential;
  a third P-type MOS transistor in which a gate is supplied with an output signal of the switching circuit, a source is grounded and a drain is connected to a drain of the second P-type MOS transistor; and
  a plurality of fourth N-type MOS transistors in which a gate and a source are grounded and a drain is connected to a drain of the second P-type MOS transistor.

* * * * *